United States Patent [19]

Komoriya et al.

[11] Patent Number: 5,432,608
[45] Date of Patent: * Jul. 11, 1995

[54] METHOD OF MAKING SEMICONDUCTOR INTEGRATED CIRCUIT, PATTERN DETECTING METHOD, AND SYSTEM FOR SEMICONDUCTOR ALIGNMENT AND REDUCED STEPPING EXPOSURE FOR USE IN SAME

[75] Inventors: Susumu Komoriya; Takao Kawanabe, both of Tokorozawa; Shinya Nakagawa, Tachikawa; Takayoshi Oosakaya, Iruma; Nobuyuki Iriki, Kodaira, all of Japan

[73] Assignee: Hitachi, Ltd., Tokyo, Japan

[*] Notice: The portion of the term of this patent subsequent to Nov. 9, 2010 has been disclaimed.

[21] Appl. No.: 111,310

[22] Filed: Aug. 24, 1993

Related U.S. Application Data

[63] Continuation of Ser. No. 811,059, Dec. 20, 1991, Pat. No. 5,260,771, which is a continuation of Ser. No. 313,180, Feb. 21, 1989, Pat. No. 5,094,539.

[30] Foreign Application Priority Data

| Mar. 7, 1988 | [JP] | Japan | 63-53899 |
| Oct. 14, 1988 | [JP] | Japan | 63-259027 |
| Oct. 28, 1988 | [JP] | Japan | 63-270669 |
| Jan. 20, 1989 | [JP] | Japan | 1-009744 |

[51] Int. Cl.⁶ .................... G03F 9/00; H01L 21/30
[52] U.S. Cl. .................................................. 356/401
[58] Field of Search .................................... 356/401

[56] References Cited

U.S. PATENT DOCUMENTS

| 4,269,505 | 5/1981 | Mayer . |
| 4,355,892 | 10/1982 | Mayer et al. . |
| 4,492,459 | 1/1985 | Omata . |
| 4,614,432 | 9/1986 | Kuniyoshi et al. . |
| 4,668,089 | 5/1987 | Oshida et al. . |
| 4,741,622 | 5/1988 | Suwa et al. . |
| 4,798,962 | 1/1989 | Matsumoto et al. . |
| 4,938,598 | 7/1990 | Akiyama et al. . |
| 5,094,539 | 3/1992 | Komoriya et al. . |
| 5,137,363 | 8/1992 | Kosugi et al. ........................ 356/401 |
| 5,260,771 | 11/1993 | Komoriya et al. ................... 356/401 |

FOREIGN PATENT DOCUMENTS

| 60-177625 | 9/1985 | Japan . |
| 61-203640 | 9/1986 | Japan . |
| 62-293718 | 12/1987 | Japan . |

OTHER PUBLICATIONS

Donald H. Jacobs, *Fundamentals of Optical Engineering,* pp. 42–45, McGraw-Hill, New York, 1943.

Primary Examiner—Richard A. Rosenberger
Attorney, Agent, or Firm—Antonelli, Terry, Stout & Kraus

[57] ABSTRACT

According to the present invention, in making alignment between a semiconductor integrated circuit wafer and a mask or a reticle in light exposure of the wafer with a monochromatic light such as g-, i- or h-line of a mercury lamp, using a reduced stepping exposure system, light from a predetermined pattern on the wafer is taken out to an off-axis position and observed according to Through-the-Lens method; in this case as a characteristic feature of the invention, the observation light taken out from below the reticle is passed through chromatic aberration correcting lenses, thereby permitting the use of a polychromatic or continuous spectrum light.

51 Claims, 29 Drawing Sheets

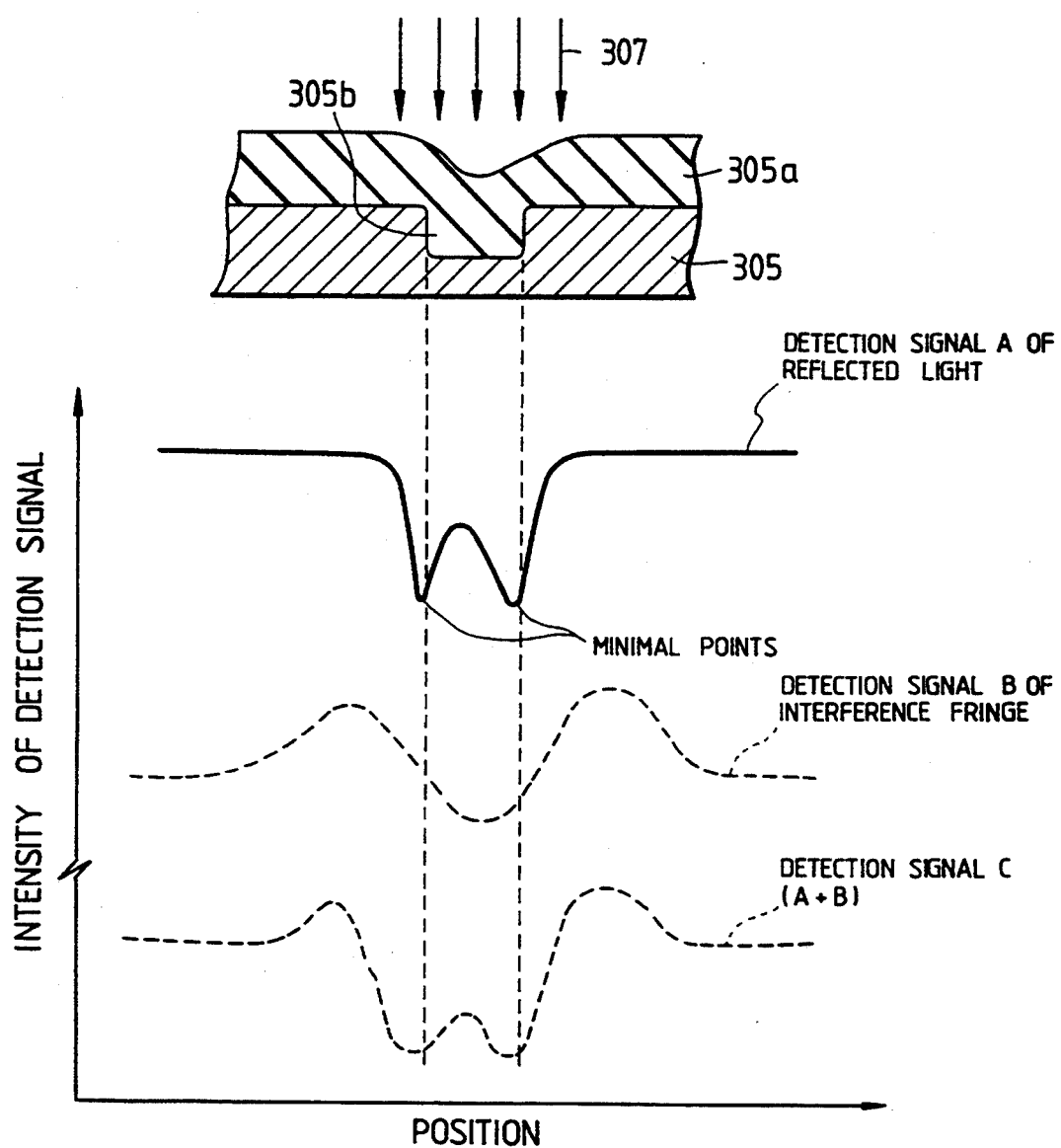

METHOD OF MAKING SEMICONDUCTOR INTEGRATED CIRCUIT, PATTERN DETECTING METHOD, AND SYSTEM FOR SEMICONDUCTOR ALIGNMENT AND REDUCED STEPPING EXPOSURE FOR USE IN SAME

This is a continuation of application Ser. No. 811,059, filed on Dec. 20, 1991, now U.S. Pat. No. 5,260,771, which is a continuation of application Ser. No. 313,180, filed on Feb. 21, 1989, now U.S. Pat. No. 5,094,539.

BACKGROUND OF THE INVENTION

The present invention relates to an alignment technique and more particularly to a technique which is effective in the application to alignment of a semiconductor wafer (hereinafter referred to simply as "wafer") with respect to a mask in a reduced projection exposure step in the production of a semiconductor device.

For transferring a circuit pattern formed using a light shielding film on a mask such as a reticle onto a wafer, there usually is adopted a method which employs a reduced projection exposure system. In this case, the wafer-mask alignment is performed in the following manner for example.

Illumination light is radiated through a reduced projection lens to an alignment mark formed in a stepped uneven shape on the surface of a wafer, then reflected light from the alignment mark is made incident on a TV camera through a beam splitter, etc., and an electric signal is detected on the basis of the quantity of light of the reflected light to thereby grasp the position of the alignment mark and effect positioning of an area to be exposed of the wafer relative to the mask. Such a positioning technique is generally called "through the lens" (TTL) method.

As a literature pointing out problems to be solved of the TTL method there is "Nikkei Micro Devices," Nikkei McGraw-Hill Inc. (Dec. 1, 1987), pp.70–72.

An alignment technique commonly adopted according to the TTL method will be explained below with reference to FIG. 5.

In FIG. 5, the numeral 71 denotes a wafer as an object to be exposed; numeral 72 denotes a reduced projection lens for exposure which is positioned just above the wafer 71; numeral 73 denotes a reticle as a master plate; numeral 74 denotes a TV camera as a recognizer; and numeral 75 denotes a mercury lamp serving as both an exposure light source and an illumination light source. On the optical path of the reduced projection lens 72 and TV camera 74 there are disposed a reflecting mirror 76, a relay lens 77 and a beam splitter 78. Light transmitted by the beam splitter 78 is received by the TV camera. On the other hand, between the mercury lamp 75 and the beam splitter 78 are disposed a band pass filter 80 which permits only E-line (546 nm) to pass therethrough out of rays provided from the mercury lamp 75, and a condenser lens 81.

Thus, E ray, which is a monochromatic light ray, is used as an illumination light for the detection of a pattern, while at the time of exposure there is used G-line (436 nm) which is an exposure light.

The illumination light is radiated by the beam splitter 78 onto the wafer 71 via the relay lens 77, reflecting mirror 76 and reduced projection lens 72, and the reflected light travels backward through the above path and is incident on the TV camera 74. On the basis of the image recognized by the TV camera 74 there is made detection of waveform and a central position of such an alignment mark 6 on the wafer as shown in FIG. 4(a) is calculated.

Further, in FIG. 17(a), numeral 201 denotes a wafer as an object to be exposed; numeral 202 denotes a reduced projection lens for exposure disposed just above the wafer 201; numeral 203 denotes a reticle as a master plate; numeral 204 denotes a TV camera as a recognizer; and numeral 205 denotes a mercury lamp as an exposure light source. On the optical path of the reduced projection lens 202 and TV camera 204 are are disposed a reflecting mirror 206, a relay lens 207 and a half mirror 208. Reflected light transmitted through the half mirror 208 is received by the TV camera 204. On the other hand, between the mercury lamp 205 and the half mirror 208 are disposed a band pass filter 210 which permits only E-line (546 nm) to pass therethrough out of the rays provided from the mercury lamp 205, and a condenser lens 211.

Illumination light emitted from the mercury lamp 205 is applied onto the wafer 201 via the half mirror 208, relay lens 207, reflecting mirror 206 and reduced projection lens 202, while the reflected light from the wafer 201 travels backward along the above optical path and is received by the TV camera 204, and on the basis of the image recognized by the TV camera 204 there is made waveform detection.

FIG. 17(b) is a partially sectional view schematically showing an alignment pattern 212 formed on the wafer 201.

The alignment pattern 212, which is formed in synchronism with a wiring pattern, etc. on the wafer 201, has a concave section with both inner side-ends formed edge-like. Illumination light is radiated vertically from above to the wafer surface formed with such alignment pattern 212, and it has been premised that the light reflected by the wafer surface will travel backward along the same optical path as that of the illumination light.

As shown in the same figure, when the alignment pattern 212 is formed on the wafer 201 in an ideal condition without distortion, the resulting waveform exhibits peak values at the paired edge portions as shown in FIG. 17(c). A central position $[(X_R+X_L)/2]$ of the alignment mark 212 is determined by calculation on the basis of coordinates $X_R$, $X_L$ of both peak values, and alignment is effected using it as a reference value $X_O$.

Further, a brief explanation will be made below about prior art publications which may be related to the present invention.

In Suzuki et al's Japanese Patent Laid-Open No. 293718/87 (laid open Dec. 21, 1987) there is disclosed a correction lens system for the correction of spherical aberration, astigmatism and coma aberration in a stepper having aligning optical system using a single wave length light.

In Komoriya et al' Japanese Patent Laid-Open No. 177625/85 (laid open Sep. 11, 1985) there is shown an example of inserting a chromatic aberration correcting lens system in an off-axis portion of an on-axis aligning optical system in a stepper having an aligning optical system using a continuous spectrum.

In Sugiyama's Japanese Patent Laid-Open No. 203640/86 (laid open Sep. 9, 1986) there is disclosed a struture for conducting light which has passed through a reticle or a mask to a detection system through a chromatic aberration correcting lens in an aligning optical system of a stepper similar to the above.

Further, in Shiba et al's Japanese Patent Laid-Open No. 251858/86 (laid open Nov. 8, 1986) it is disclosed that a cylindrical inner-surface mirror is used in the feed path of an exposure light source.

BRIEF SUMMARY OF THE INVENTION

However, the present inventors found that the following problems were involved in the reduced projection exposure system of the structure shown in FIG. 5.

The wafer as an object to be exposed is fed to the reduced projection exposure system in an applied state of a photoresist film 82 thereon. The application of the photoresist film 82 is performed by dropping resist liquid under rotation of the wafer 71 and utilizing the spread of the resist liquid caused by centrifugal force.

Consequently, due to the centrifugal force during rotation mentioned above, the photoresist film 82 becomes non-uniform in its thickness near the stepped portions of the alignment mark; particularly, the deposited shape of the photoresist film 82 becomes asymmetric with respect to the center of the stepped pattern. In this connection, as the illumination light for the alignment there usually is employed G-line (436 nm) at a single wave length (monochromatic light) which ray is used for exposure, resulting in that an interference fringe formed by the reflected light from the upper surface of the stepped pattern and that from the upper surface of the photoresist film 82 becomes asymmetric, and a signal voltage waveform obtained from the said interference fringe which is an image recognized by the TV camera also becomes asymmetric and complicated. Consequently, it sometimes becomes difficult to detect the stepped pattern of the alignment mark.

In this connection, several means are introduced in the foregoing literatures for solving the above-mentioned problem, but none of them are satisfactory.

Also in FIGS. 17(a) to 17(c), during formation of the alignment pattern 212 of aluminum, there arises unevenness in film thickness at the bottom of the stepped portion so the same pattern becomes asymmetric in sectional shape, resulting in that the reflection angle of light is disturbed, causing distortion in the waveform of edges detected, and so it is difficult to grasp the coordinates of edge positions exactly.

Further, in the event of breakage of an edge at an end portion thereof, it sometimes becomes difficult to grasp the coordinates of the edge position due to irregular reflection from the broken surface.

The present invention has been accomplished taking note of the problems mentioned above. It is an object thereof to provide a technique capable of accurately effecting the detection of a pattern on a wafer coated with a photoresist film and thereby capable of realizing a high accuracy alignment.

It is another object of the present invention to provide a technique capable of detecting edge coordinates accurately and enhancing the alignment accuracy without being influenced by the distortion of an alignment pattern.

It is a further object of the present invention to permit stepper alignment using a polychromatic light or "white" light.

It is a still further object of the present invention to provide a reference optical system of a stepper capable of removing various aberrations accurately.

It is another object of the present invention to provide a stepper capable of easily effecting a sequential control such as reduced magnification.

It is yet another object of the present invention to provide a position detecting method adapted to a double-layer aluminum wiring process.

It is a further object of the present invention to provide an exposure process adapted to a wafer process for a memory IC such as DRAM having a double-layer aluminum wiring (incl. multi-layer Al wiring).

It is a still further object of the present invention to provide a method of improving the Köler's illumination difficult to induce interference.

Typical embodiments of the invention disclosed herein will be summarized below.

An embodiment of the invention is provided with a light source for radiating a continuous spectrum light of at least two wave lengths to an object to be exposed through a reduced projection lens, a recognizer which receives the light reflected from the object to be exposed and recognizes position, and a chromatic aberration correcting lens mechanism disposed on the optical path of the reflected light in a position between the object to be exposed and the recognizer.

According to the above means wherein the chromatic aberration correcting lens mechanism is disposed on the illumination light optical path, it is possible to use a continuous spectrum light of two or more wave lengths as the pattern illumination light by adjusting the focal length in accordance with each wave length. Consequently, for example, even where the photoresist film is non-uniform in thickness and asymmetric with respect to the alignment pattern of the detection area, it is possible to prevent the impossibility of detection caused by an asymmetric interference fringe such as that in the use of a single wavelength light, and thereby enhance the positioning accuracy at the time of alignment.

According to another typical embodiment of the invention, in optically detecting a stepped pattern formed on a semiconductor device, an illumination light is radiated to the stepped portion inclinedly relative to a vertical reference optical axis through the semiconductor device surface.

Further, a first coordinate value obtained by radiating an illumination light to the stepped portion inclinedly relative to the vertical reference optical axis through the semiconductor device surface is compared with a second coordinate value obtained by the radiation of a vertical illumination light parallel to the vertical reference optical axis to thereby calculate the amount of correction for the second coordinate value of the vertical illumination light. And in the pattern detection which follows, the said amount of detection is added to the coordinate value obtained by the radiation of the vertical illumination light to calculate a true coordinate value.

According to the above means, the illumination light is radiated at a predetermined angle of inclination relative to the vertical reference optical axis of the pattern, whereby it is possible to accurately detect the position of one of both edges of the pattern. Thus, by repeating the radiation of the illumination light to the pattern under varying inclination angles, it becomes possible to accurately detect the position of even a distorted or sectionally asymmetric pattern, thereby permitting enhancement of the alignment accuracy.

Further, by calculating the amount of correction through the comparison between the first and the second coordinate value, the amount of deviation in the detection using the vertical illumination light becomes clear, so an efficient alignment processing can be realized in the succeeding detection of position by correcting the data obtained from only the vertical illumination light.

BRIEF DESCRIPTION OF THE DRAWINGS

FIG. 23 is a view explanatory of a correlation between the shape of an alignment mark and detection signals;

DETAILED DESCRIPTION OF THE INVENTION

Figure 1A:
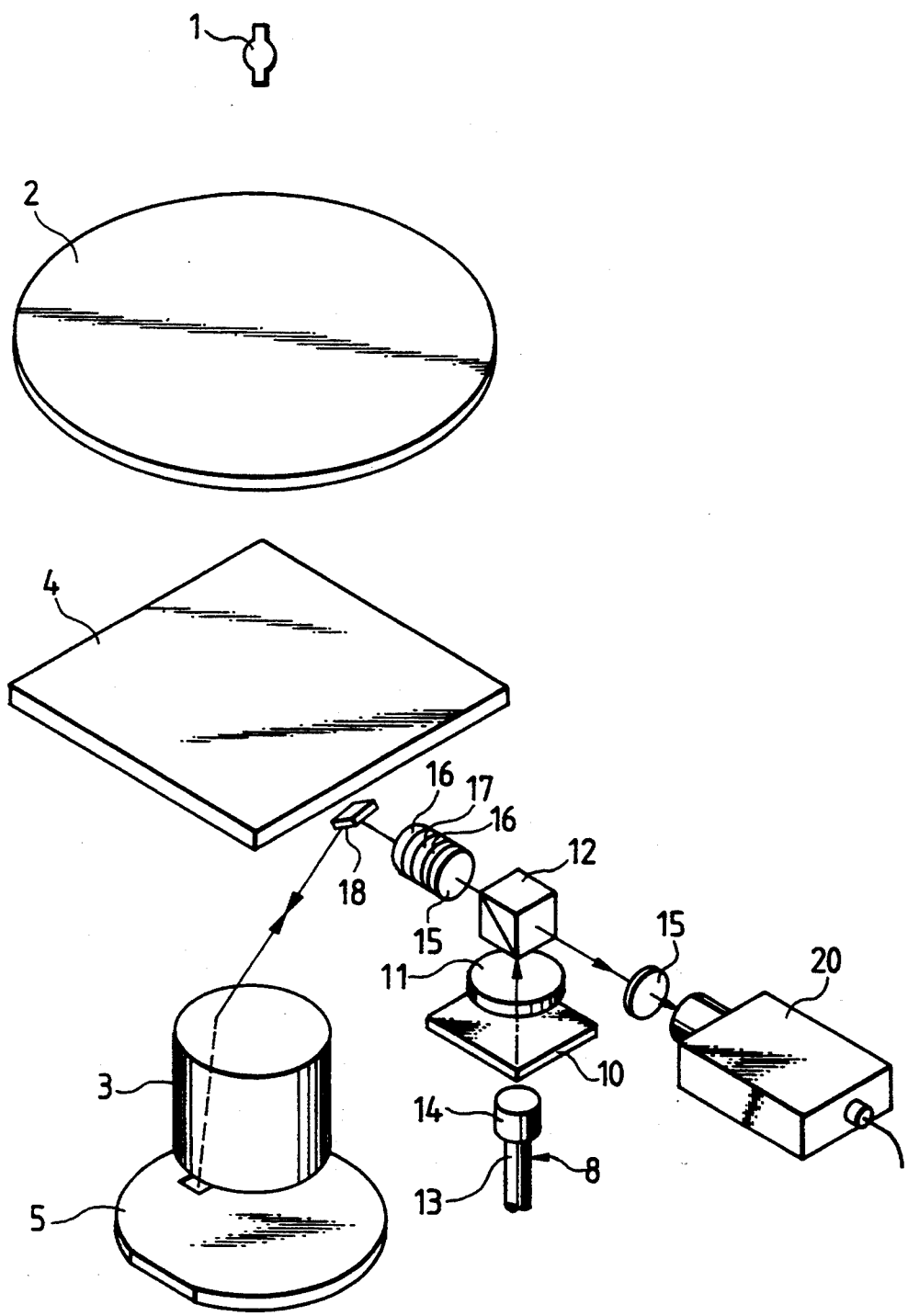
FIG. 1(a) is a perspective view of principal components of a reduced projection exposure system according to an embodiment-1 of the present invention.

Improved points of the present invention will be described hereinunder in terms of embodiments, but it is to be understood that the components of the embodiments are replaceable with one another and that the embodiments are part of an integral invention, having something to do with one another.

Therefore, it is to be understood that the components having reference numerals whose latter two figures in the drawings are the same fulfil the same or similar functions in principle unless otherwise described. (1) Embodiment-1

Figure 1B:
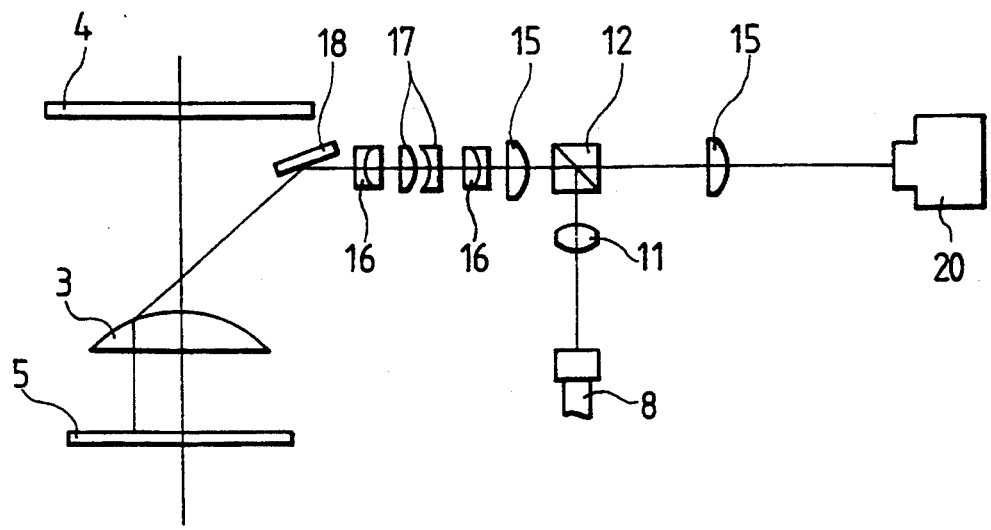
FIG. 1(b) is a system diagram showing an optical system used in the detection of a pattern according to the embodiment-1.
Figure 2A:
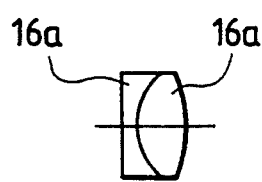
FIGS. 2(a) and 2(b) are explanatory views each showing a chromatic aberration correcting lens used in the embodiment-1.
Figure 2B:
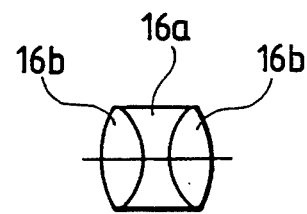
Figure 2C:
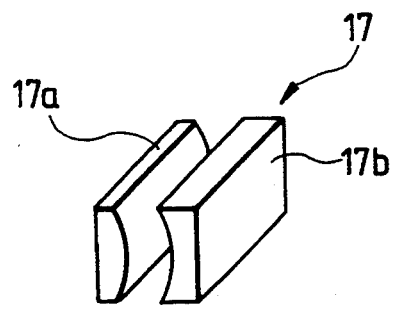
FIG. 2(c) is a perspective view showing an astigmatism correcting lens used in the embodiment-1.
Figure 3A:
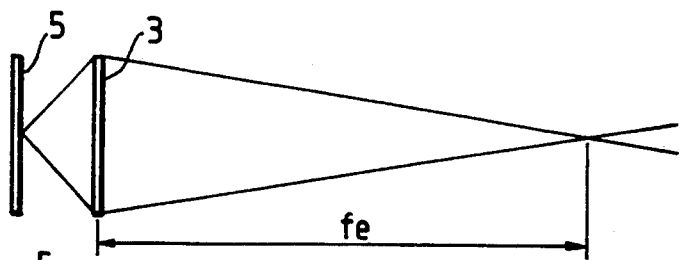
FIGS. 3(a) to 3(c) are explanatory views conceptually showing correction principles using the chromatic aberration correcting lens in the embodiment-1.
Figure 3B:
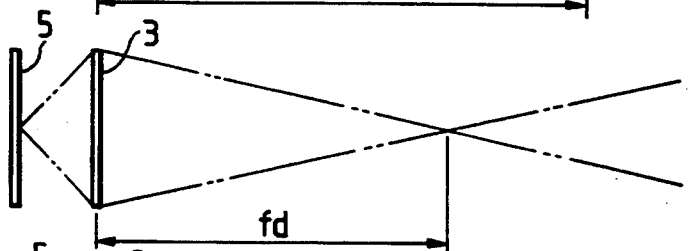
Figure 3C:
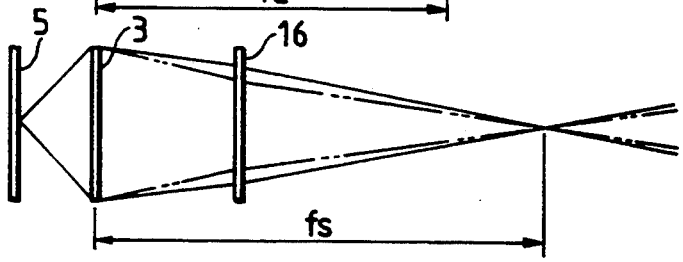
Figure 4A:
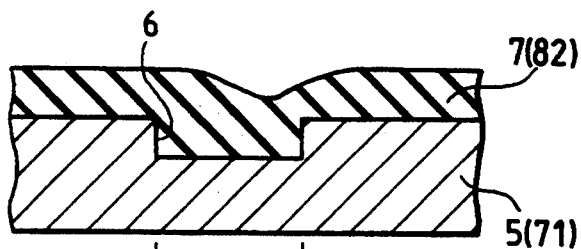
FIG. 4(a) and 4(b) are explanatory views showing the relation between an alignment mark formed on a wafer and a detected waveform in the embodiment-1.
Figure 4B:
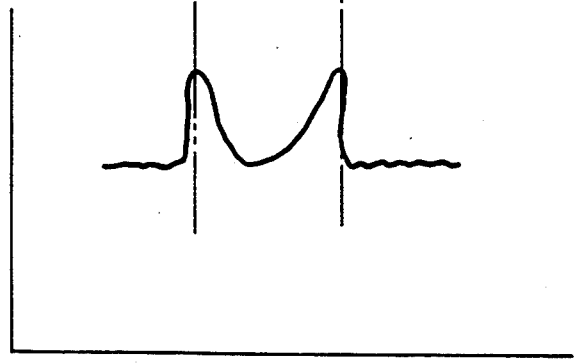
Figure 5:
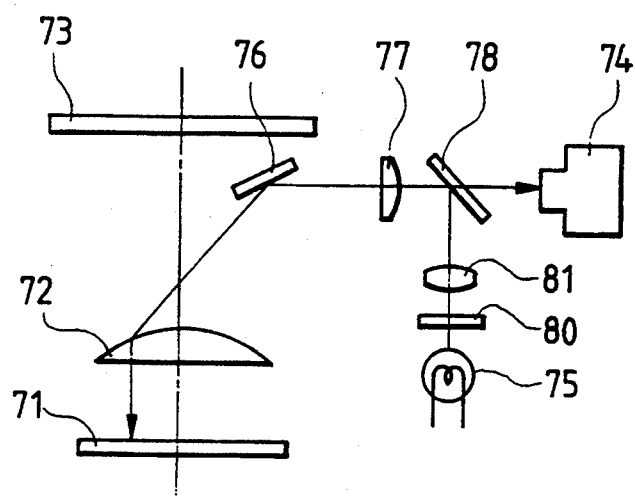
FIG. 5 is a system diagram showing an optical system used in the conventional pattern detection.

FIG. 1(a) is a perspective view of principal components of a reduced projection exposure system according to embodiment-1 of the present invention; FIG. 1(b) is a system diagram showing an optical system used in this embodiment; FIGS. 2(a) and 2(b) are explanatory views each showing a chromatic aberration correcting lens; FIG. 2(c) is a perspective view showing an astigmatism correction lens used in this embodiment; FIGS. 3(a) to 3(c) are explanatory views conceptually showing principles of correction using the chromatic aberration correcting lens in this embodiment; and FIGS. 4(a) and 4(b) are explanatory views showing the relation between an alignment mark formed on a wafer and a detected wave form.

The reduced projection exposure system of this embodiment has an optical exposure system which comprises an exposure light source 1 comprising a mercury lamp, a condenser lens 2 for condensing an exposure light emitted from the exposure light source 1, and a reduced projection lens 3.

Between the condenser lens 2 and the reduced projection lens 3 is removably disposed a reticle (master plate) 4 which comprises a transparent quartz glass substrate or the like and an integrated circuit pattern formed thereon using a light shielding film of chromium (Cr) for example.

On the other hand, under the reduced projection lens 3 is placed a wafer (an object to be exposed) 5 which is movable in a horizontal plane on an XY stage. On the wafer 5 is formed a predetermined alignment mark 6 in a stepped fashion as shown in FIG. 4(a), the upper surface of which is coated with a photoresist film 7 by a rotational application technique. More specifically, in FIG. 1(a), an exposure light emitted from the exposure light source 1 and passed through the reticle 4 is reduced to a predetermined magnification (e.g. 1/5) by the reduced projection lens 3 and is then projected onto the wafer 5, whereby the photoresist film 7 formed on the surface of the wafer 5 is exposed to a predetermined pattern.

Near the optical exposure system is disposed an illumination light source 8. An illumination light emitted from the illumination light source 8 is incident on a beam splitter 12 of a half mirror structure through a band pass filter 10 and a condenser lens 11 which are disposed on an optical path of the illumination light.

In this embodiment, the illumination light source 8 comprises an optical fiber 13 or any other suitable light conducting means for conducting light from the exposure light source 1, and a cylindrical mirror 14 mounted on an end portion of the optical fiber.

The band pass filter 10 permits only E-line (546 nm) and D-line (589 nm) to pass therethrough out of light wave lengths provided from the mercury lamp as the exposure light source 1. The illumination light which has passed through the band pass filter 10 is incident on the beam splitter 12 as a continuous spectrum light in a visible light range. On the optical axis of the beam splitter 12 are disposed a relay lens 15, a chromatic aberration correcting lens 16 and an astigmatism correction lens 17, thereby permitting the light to reach a reflecting mirror 18 which is disposed sideways above the reduced projection lens 3.

On the other hand, a TV camera 20 serving as a recognizer through the relay lens 15 is disposed on the optical axis of the beam splitter 12 in a symmetric position with respect to the relay lens 15.

The chromatic aberration correcting lens 16 which is a characteristic component in this embodiment will be described below in detail.

Figure 6A:
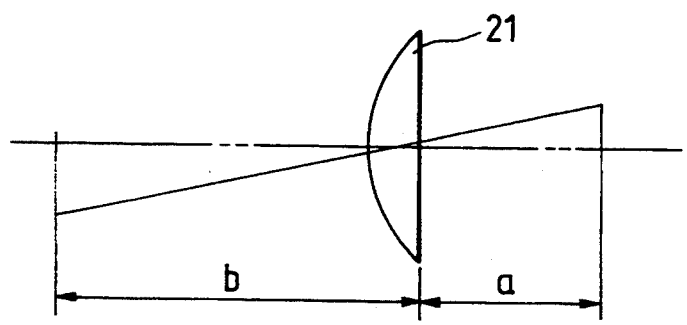
FIGS. 6(a) and 6(b) are views for explaining chromatic aberration.
Figure 6B:
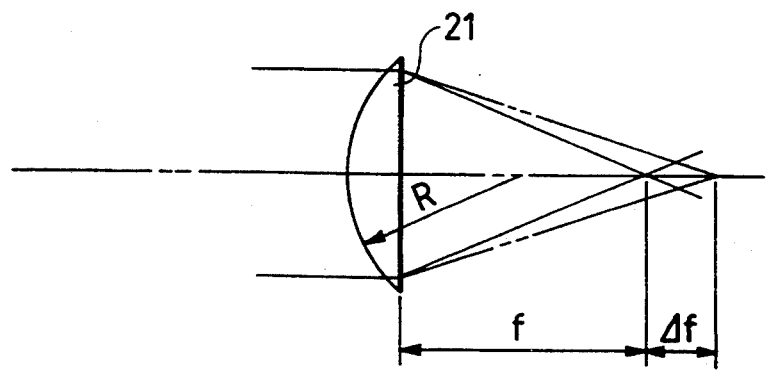

Prior to the description of the lens 16, chromatic aberration will now be explained with reference to FIGS. 6(a) and 6(b). In these figures, the reference marks a and b represent distances up to imaging positions from a lens 21. If the focal length of the lens 21 is f, then, a, b and f are in the following relationship:

$$\frac{1}{a} + \frac{1}{b} = \frac{1}{f} \quad (1)$$

When the focal length changes by $\Delta f$, the change $\Delta b$ of the imaging position is as follows according to the above equation (1):

$$\Delta b = \frac{b^2}{f^2} \Delta f \quad (2)$$

On the other hand, as shown in FIG. 8(b), the focal length, f, and refractive index, n, of the lens 21 are in the following relationship:

$$f = \frac{R}{(n - 1)} \quad (3)$$

In the above equation (3), R represents a radial length of the spherical surface of the lens 21.

From the equation (3), the change $\Delta f$ in focal length caused by a change $\Delta n$ in refractive index is:

$$\Delta f = -\frac{R}{(n - 1)^2} \Delta n = -\frac{f}{(n - 1)} \Delta n \quad (4)$$

Substituting this into equation (2) gives:

$$\Delta b = -\frac{b^2}{f(n - 1)} \Delta n \quad (5)$$

Since the imaging magnification, m, is b/a, the above equation (5) may be written as:

$$\Delta b = -\frac{f(1 + m)^2}{(n - 1)} \Delta n \quad (6)$$

From the equation (6) it can be seen that the imaging position changes by $\Delta b$ with the change $\Delta n$ of the refractive index. In this connection, since the wave length of light and the refractive index, n, are inversely proportional to each other, the imaging position shifts by $\Delta b$ towards the lens 21 as the wave length becomes longer. This is chromatic aberration. The reduced projection lens 3 used in the reduced projection exposure system is generally designed to have optical characteristics most suitable to G-line as the exposure light, so consideration is not given to the deviation of focal length in the case of using E- or D-line as the illumination light.

Where a continuous spectrum light of E- and D-lines is used for preventing the impossibility of detection caused by interference fringe, the E-line of a short wave length will be focused relatively near the lens, while the D-line of a longer wave length will be focused in a position farther from the lens. According to our calculation, the difference in imaging position in the TV camera 20 between both lines which have passed through the optical system for alignment is as large as about several ten millimeters. This point is overcome by the chromatic aberration correcting lens 16 in this embodiment.

More specifically, the chromatic aberration correcting lens 16 has the function of maintaining the imaging position constant irrespective of whether the incident wave length is large or small. It is adjusted so that the imaging distance is made small with respect to light of a small refractive index and made large with respect to light of a large refractive index.

The chromatic aberration correcting lens 16, for example as shown in FIGS. 2(a) and 2(b), is constituted by a combination of a convex lens 16a comprising a flint glass and a convex lens 16b comprising a crown glass. In this embodiment there are used a pair of chromatic aberration correcting lenses 16 of the construction described above. There may be adopted such a combination as shown in FIG. 2(b). The chromatic aberration correcting lens 16 is not specially limited if only it can correct chromatic aberration in a wave length region including E- and D-lines in a chromatic aberration correctable range of $\Delta = 500$ nm to 590 nm in terms of wave length, $\Delta$. As to the said chromatic aberration correctable range, adjustment can be made by changing the spacing between the paired correction lenses 16.

It is FIGS. 3(a) to 3(c) that conceptually show principles of the chromatic aberration correcting lens 16 described above. FIG. 3(a) shows an imaging distance fe in the incidence of a monochromatic light of E-line before the correction of chromatic aberration; FIG. 3(b) shows an imaging distance fd of D-line, and FIG. 3(c) shows an imaging distance fs of E- and D-lines in the case where the correction of chromatic aberration is made through the chromatic aberration correcting lens 16 disposed on the optical path of the illumination light. The imaging distance fs in FIG. 3(c) is adjusted so as to be an intermediate point between the imaging distances in FIGS. 3(a) and 3(b), that is, approximately fs=(fe+fd)/2. Therefore, where a continuous spectrum light of E- and D-lines is used as the illumination light, it is possible to maintain the imaging position constant by suppressing chromatic aberration. As a result, it is possible to prevent the impossibility of the detection of position caused by an asymmetric interference fringe which occurs in the use of a chromatic light of E- or D-line alone, and so a highly accurate alignment pattern detection can be effected by the TV camera 20.

In this embodiment, such an astigmatism correction lens 17 as shown in FIG. 2(c) is disposed on the optical path of the illumination light in a position between a pair of chromatic aberration correcting lenses 16. The astigmatism correction lens 17 is for correcting the deviation in XY direction of a detected image on the wafer 5 caused by astigmatic light beam, that is, astigmatism. It comprises a combination of a convex lens 17a of a cylindrical lens and a convex lens 17b. Thus, according to this embodiment, an illumination light which has been corrected in both chromatic aberration and astigmatism is incident on the TV camera 20, so it becomes possible to effect the detection of position through a highly accurate image recognition.

The following is an explanation about the method of making alignment according to this embodiment.

First, when an illumination light is radiated from the cylindrical mirror 14 at the end of the optical fiber 13 as the illumination light source 8 by moving the XY stage, it passes through the band pass filter 10 and the condenser lens 11, then is refracted by the beam splitter 12 and illuminates a predetermined area of the wafer 5 via the relay lens 15, chromatic aberration correcting lenses 16 and astigmatism correction lens 17, further through the reflecting mirror 18 and the reduced projection lens 3. The reflected light from the wafer 5 travels backward through the above path and reaches the beam splitter 12 via the reduced projection lens 3, reflecting mirror 18, chromatic aberration correcting lenses 16 and astigmatism correction lens 17. Then, the reflected light passes through the beam splitter 12 and reaches the TV camera 20 through the relay lens 15. To the TV camera 20 is connected a signal processing section to detect a signal wave form from an image recognized by the same camera.

It is FIG. 4(b) that shows such detected signal waveform. According to this embodiment, since the chromatic aberration correcting lenses 16 are disposed on the optical path of the illumination light, chromatic aberration, i.e., deviation of the imaging position, can be corrected even where a continuous spectrum light of E- and D-lines is used as the illumination light. As a result, it is possible to avoid the difficulty in detecting the alignment mark 6 caused by an interference wave form which is attributable to unevenness in the photoresist film thickness in the use of a chromatic light as the illumination light source 8, and it is possible to surely grasp detected signals corresponding to the stepped portions of the alignment mark 6 as shown in FIG. 4(b), thus permitting an exact detection of the position of the same mark. The area to be exposed of the wafer 5 is accurately positioned on the optical exposure system on the basis of the thus-detected position of the alignment mark 6. Thereafter, the integrated circuit pattern on the reticle 4 is transferred onto the photoresist film 7 of the wafer 5 by an exposure light which has been emitted from the exposure light source 1 and passed through the condenser lens 2, reticle 4 and reduced projection lens 3.

Although in the above description the mercury lamp which is the exposure light source also serves as the illumination light source, there may be used a separate xenon lamp as the illumination light source. In this case, by using a xenon lamp which has a relatively uniform light energy at various wave lengths, it becomes possible to adopt a continuous spectrum light selectively, so by adjusting the correction rate of the chromatic aberration correcting lens 16 and setting an optimum correction value, it is possible to prevent the impossibility of the pattern detection caused by the interference of reflected light, thus permitting a highly accurate detection of position.

Although an embodiment of the present invention has been described concretely, it goes without saying that the invention is not limited thereto and that various modifications can be made within the scope not departing from the gist of the invention.

For example, although the cylindrical mirror mounted on an end portion of the optical fiber was shown as an example of the illumination light source, there may be adopted any other shape, e.g. prismatic or pyramidal shape.

Further, although in the above description the present invention was applied to the alignment technique in the so-called reduced projection exposure for a wafer as a utilization field of the invention, this constitutes no limitation and the invention is widely applicable to the alignment technique in the general reduced projection exposure.

Typical effects attained by the embodiment described above will be described below briefly.

According to the present invention, the chromatic aberration correcting lens mechanism is disposed on the optical path of illumination light to adjust the focal length in response to various wave lengths, whereby it becomes possible to use a continuous spectrum light of two or more wave lengths as the pattern illumination light. Consequently, for example, even when the photoresist film thickness is non-uniform and asymmetric for the alignment pattern on the area to be detected, it is possible to prevent the detection of position from becoming infeasible due to interference as in the use of a single wavelength light, and so the positioning accuracy at the time of alignment can be enhanced.

(2) Embodiment-2(I)

Figure 7:
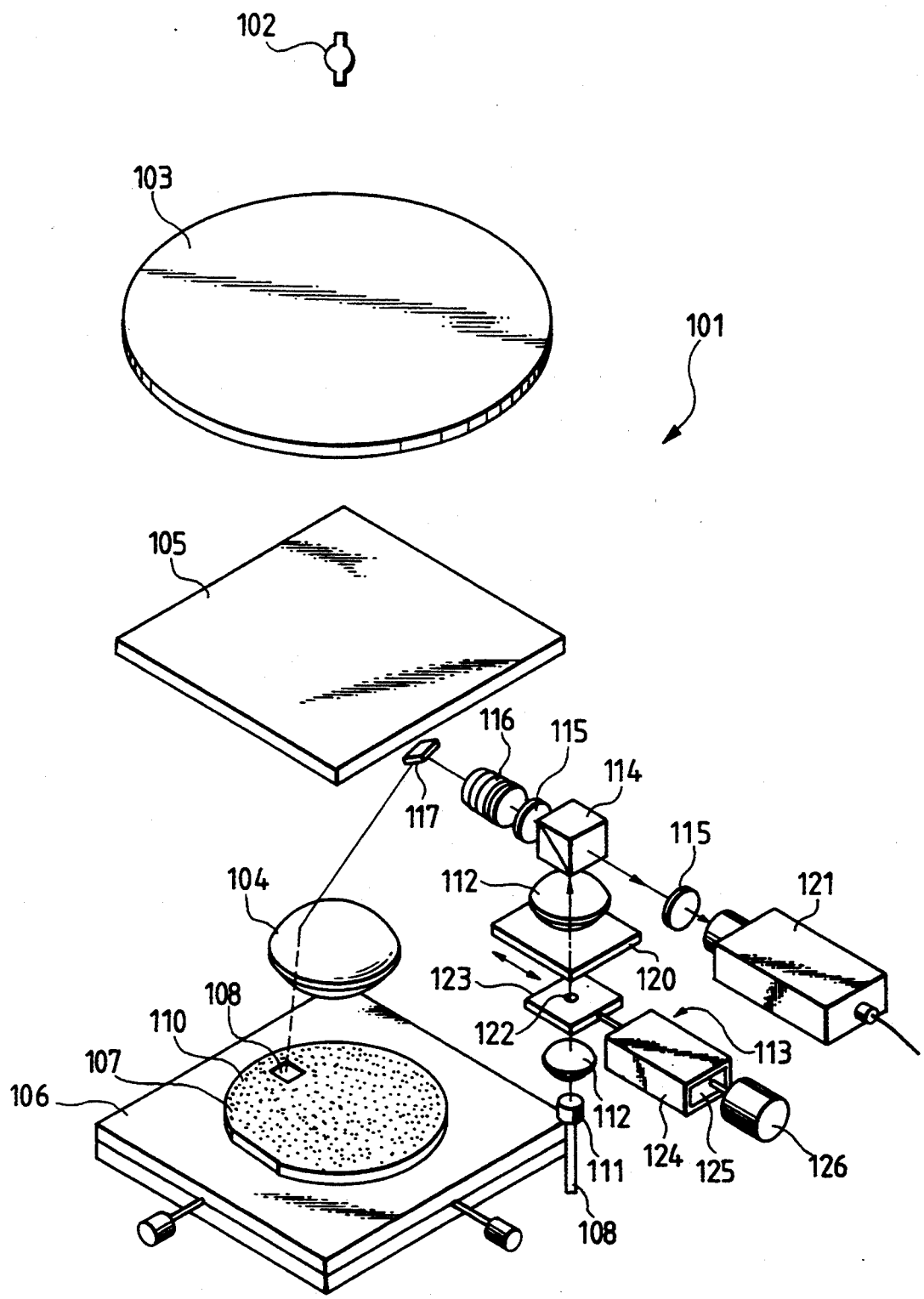
FIG. 7 is a perspective view of principal components of a reduced projection exposure system used in an embodiment-2(I) of the present invention.
Figure 8:
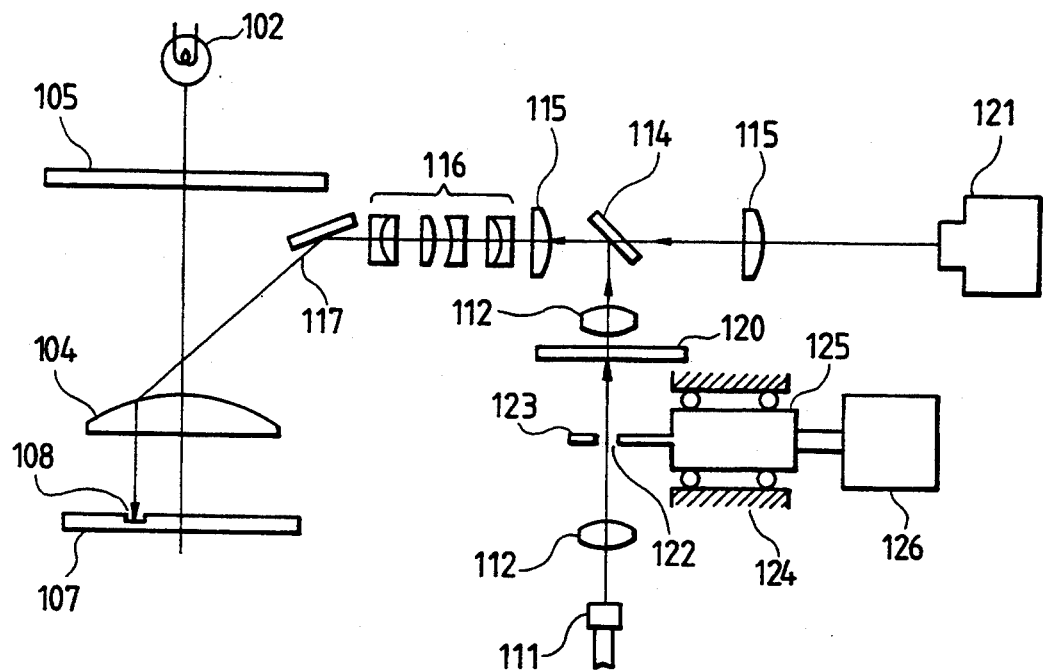
FIG. 8 is a system diagram for explaining an optical system used therein.
Figure 10A:
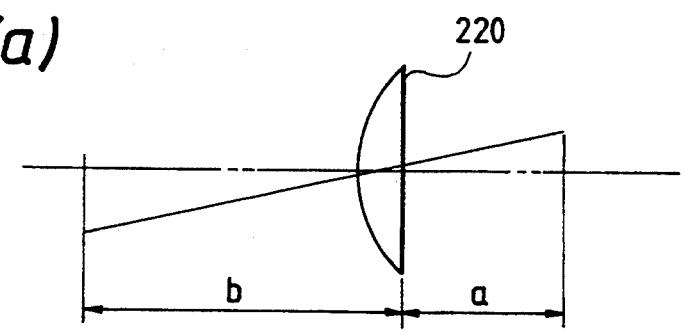
FIGS. 10(a) and 10(b) are views explanatory of chromatic aberration in the embodiment-2(I)
Figure 10B:
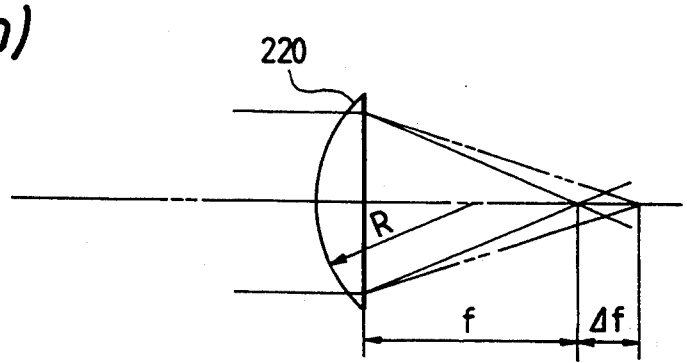
Figure 9A:
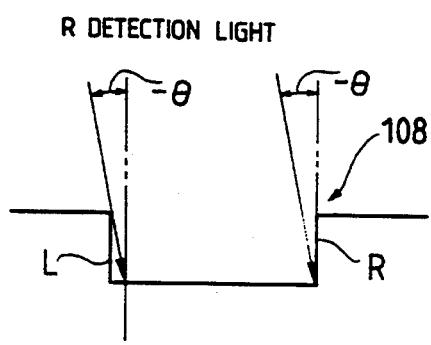
FIGS. 9(a) to 9(d) are explanatory views each showing an inclined state of an optical axis inclined by an optical axis moving portion.
Figure 9B:
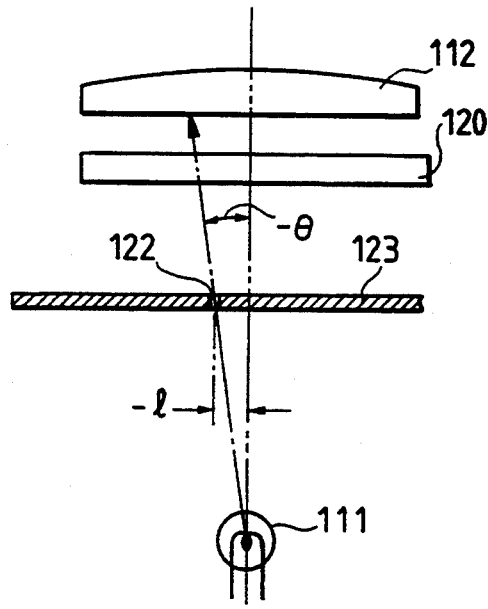
Figure 9C:
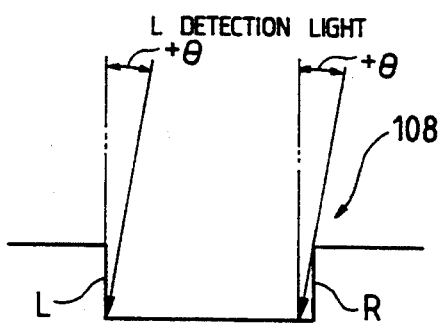
Figure 11A:
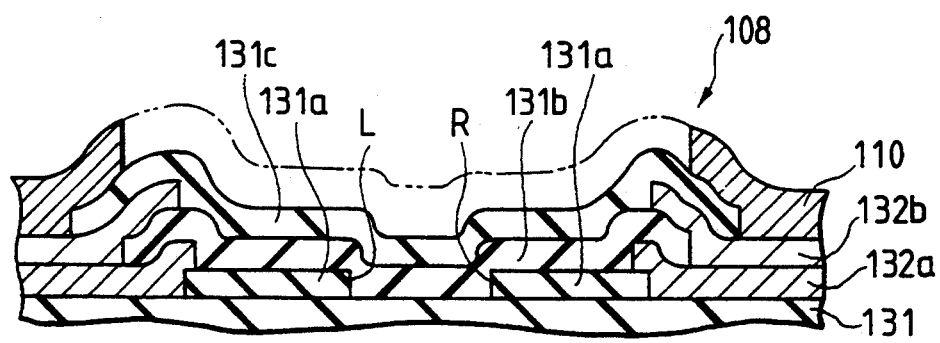
FIGS. 11(a) and 11(b) are a partial sectional view and a plan view, respectively, showing an alignment pattern formed on a wafer.
Figure 11B:
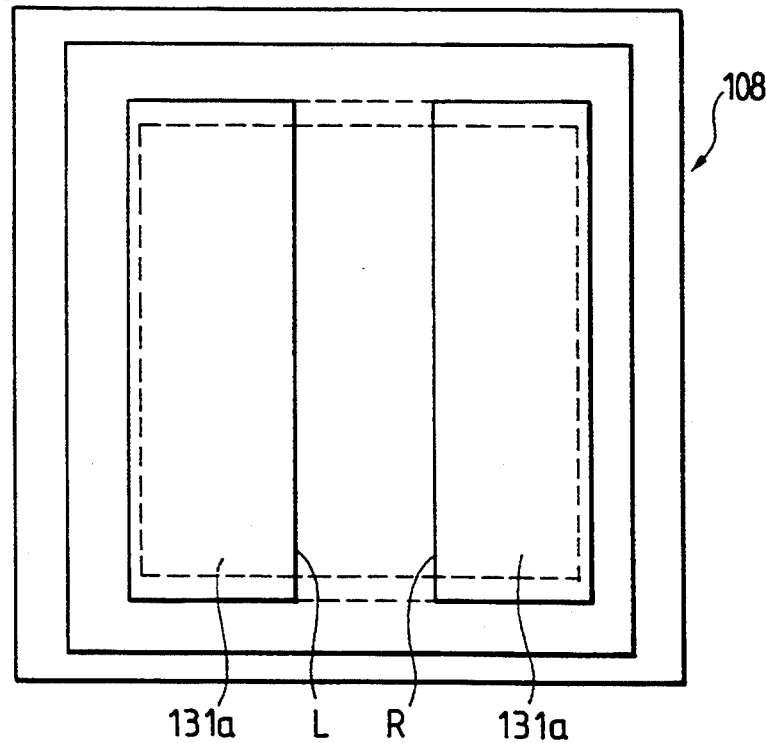
Figure 13A:
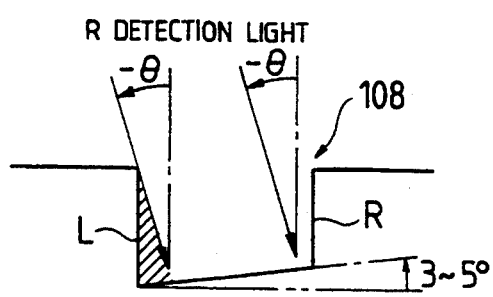
Figure 13B:
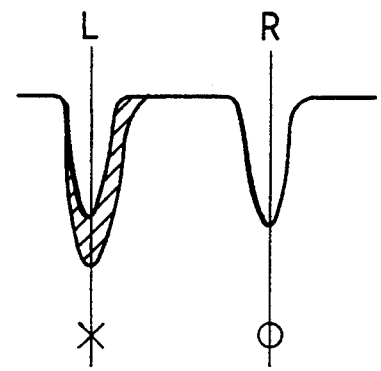

FIG. 7 is a perspective view of principal components of a reduced projection exposure system used in embodiment-2(I) of the present invention; FIG. 8 is a system diagram for explaining an optical system used therein; FIGS. 9(a) and 9(b) are explanatory views each showing an inclined state of an optical axis inclined by an optical axis moving portion; FIGS. 10(a) and 10(b) are views explanatory of chromatic aberration in this embodiment; FIGS. 11(a) and 11(b) are a partially sectional view and a plan view, respectively, showing an alignment pattern formed on a wafer; FIGS. 12 to 14 are explanatory views showing pattern detecting methods used in this embodiment; FIGS. 15(a) and 15(b) are flow charts each showing a signal processing procedure in the pattern detection of this embodiment.

In FIG. 7, a reduced projection exposure system 101 has an optical exposure system which comprises an exposure light source 102 comprising a mercury lamp, a condenser lens 103 for condensing an exposure light emitted from the exposure light source 102, and a reduced projection lens 104.

Between the condenser lens 103 and the reduced projection lens 104 is removably disposed a reticle 105 (master plate) which comprises a transparent quartz glass substrate and an integrated circuit pattern formed thereon using a light shielding film of chromium (Cr) for example.

On the other hand, under the reduced projection lens 104 is placed a wafter 107 (an object to be exposed) capable of being adjusted its position in the horizontal direction on the upper surface of an XY stage 106. On the wafer 107 is formed a predetermined alignment pattern 108 in a stepped fashion as shown in FIG. 11, the upper surface of which is coated with a photoresist film 110 by a rotational application technique. More specifically, in FIG. 7, an exposure light emitted from the exposure light source 102 and passed through the reticle 105 is reduced to a predetermined magnification (e.g. 1/5) by the reduced projection lens 104 and is then projected onto the wafer 107, whereby the integrated circuit pattern on the reticle 105 is transferred onto the photoresist film 110. As a result, the exposure light-radiated portion of the photoresist film 110 undergoes a chemical change to form a resist pattern by the same film.

In the vicinity of the above optical exposure system is disposed an illumination light source 111. An illumination light emitted from the illumination light source 111 passes through a condenser lens 112 and an optical axis moving portion 113 and is reflected at a predetermined angle by a half mirror 114, then reaches the reduced projection lens 104 via a relay lens 115, a chromatic aberration correcting lens group 116 and a reflecting mirror 117. Further, the illumination light illuminates a predetermined part of the wafer 107 through the reduced projection lens 104.

In this embodiment, the illumination light source 111 comprises an optical fiber 118 or any other suitable light conducting means for conducting light from the exposure light source 102. A band pass filter 120 is disposed on the optical path of the illumination light to permit only E-line ($\Delta = 546$ nm) and D-line ($\Delta = 589$ nm) to pass therethrough out of light wave lengths provided from the mercury lamp as the exposure light source 102. The illumination light which has passed through the band pass filter 120 is incident on the half mirror 114 as a continuous spectrum light in a visible light range. Making it such a continuous spectrum light is advantageous in that the formation of interference fringe caused by a monochromatic light is prevented to thereby enhance the detection accuracy.

The illumination light which has been radiated onto the wafer 107 from the half mirror 114 via the chromatic aberration correcting lens group 116, reflecting mirror 117 and reduced projection lens 104, illuminates the predetermined alignment pattern 108 formed on the wafer 107, then the reflected light travels backward through the optical path of the above illumination light and is incident on a TV camera 121. As to the optical path of the illumination light, it will be described in more detail later.

The optical axis moving portion 113 has a shutter 123 formed with an illumination aperture 122 extending therethrough and a shutter support 125 which is movable along a guide 124 integrally with the shutter 123. The shutter support 125 can be finely adjusted by $\pm l$ in the horizontal direction by a stepping motor 126 as shown in FIGS. 9(a) and 9(b).

More specifically, when the shutter 123 is moved by a predetermined distance $\pm l$ in the horizontal direction by the rotation of the stepping motor 126, the illumination aperture 122 formed in the shutter 123 is also moved $\pm l$ in the transverse direction in the same figures, so that the optical axis of the illumination light is inclined at a predetermined angle relative to the condenser lens 112.

With such inclination of the optical axis, the illumination light which is radiated onto the alignment pattern 108 of the wafer 107 through the reduced projection lens 104, is also inclined at a predetermined angle. In this embodiment, the shutter 123 is moved $\pm l$ right- and leftwards each by a predetermined distance with respect to a vertical reference optical axis, namely, an axis perpendicular to the shutter surface, whereby the illumination light can be applied to the alignment pattern 108 at an angle of $\pm \theta$.

The chromatic aberration correcting lens group 116 used in this embodiment will be described below.

Prior to the explanation of the lens group 116, principles of chromatic aberration which occurs in the reduced projection exposure technique will now be explained briefly with reference to FIGS. 10(a) and 10(b). In these figures, the reference marks a and b represent distances up to imaging positions from a lens 220. If the focal length of the lens 220 is f, then a, b and f are in the following relationship as known well:

$$1/a + 1/b = 1/f \qquad (1)$$

when the focal length changes by Δf, the change Δb of the imaging position is as follows:

$$\Delta b = (b^2/f^2)\Delta f \qquad (2)$$

On the other hand, as shown in FIG. 10(b), the focal length, f, and refractive index, n, of the lens 220 are in the following relationship:

$$f = R/(n-1) \qquad (3)$$

In the above equation, R represents a radial length of the spherical surface of the lens 220. From the equation (3), the change Δf in focal length caused by a change Δn in refractive index is:

$$\Delta f = -R\Delta n/(n-1)^2 \qquad (4)$$
$$= -f\Delta n/(n-1)$$

Substituting the equation (4) into the equation (2) gives:

$$\Delta b = -b^2 \Delta n/f(n-1) \qquad (5)$$

Since the imaging magnification, m, is b/a, the equation (5) may be written as:

$$\Delta b = -f(1+m)^2 \Delta n/(n-1) \qquad (6)$$

From the equation (6) it can be seen that the imaging position changes by Δb with the change Δn of the refractive index, n.

Since the refractive index, n, and the wave length of light are inversely proportional to each other, the imaging position shifts by Δb towards the lens 220 as the wave length of light incident on the lens 220 becomes longer. This is chromatic aberration.

The reduced projection lens 104 used in the reduced projection exposure system is generally designed to have optical characteristics most suitable to G-line (Δ=436 nm) as the exposure light, so consideration is not given to the problem of chromatic aberration in the use of light of another wave length such as E- or D-line as the illumination light.

Therefore, where a continuous spectrum light of E- and D-lines is used as the illumination light, as previously noted, the E-line of a relatively short wave length will be focused near the lens, while the D-line of a relatively long wave length will be focused in a position farther from the lens. According to our calculation, the difference in imaging position in the TV camera 121 between both lines which have passed through the optical system for alignment without being subjected to the correction of chromatic aberration is as large as several ten millimeters.

The chromatic aberration correcting lens group 116 in this embodiment is used for correcting the above chromatic aberration, namely, the deviation of the imaging position in the use of a continuous spectrum light as the illumination light.

More specifically, the lens group 116 has the function of maintaining the imaging position constant irrespective of whether the incident wave length is large or small. It is adjusted so that the imaging distance from the lens is made small with respect to light of a large incident wave length, namely, a small refractive index, n, and made large with respect to light of a small incident wave length, namely, a large refractive index.

The chromatic aberration correcting lens group 116 comprises a suitable combination of concave lenses of flint glass and convex lenses of crown glass, for example, whereby the correction of chromatic aberration can be made in a wavelength range including E- and D-lines of A Δ=500 nm to 590 nm. The chromatic aberration correctable range can be easily adjusted by changing the lens spacing in the above combined lenses.

FIGS. 11(a) and 11(b) shows in detail a sectional structure and a planar structure, respectively, of the alignment pattern 108 formed on the wafer 107. On a semiconductor substrate 131 is formed a first pattern 131a in synchronism with the formation of a wiring pattern using aluminum (Al). Edge shapes (L, R) of the first pattern 131a are reflected in upper layers which are second and third patterns 131b, 131c. The following is a more detailed explanation about the procedure of forming the patterns 131a–131c.

After the first pattern 131a was formed on the semiconductor substrate 131 in synchronism with the formation of a first wiring (not shown), a first insulating film 132a is formed through a photoresist process. The first insulating film 132a is first formed to cover the whole surface of the alignment pattern 108, thereafter the first insulating film 132 formed on the upper surface of the first pattern 131a is removed by etching again through a photoresist process, whereby the surface of the first pattern 131a is exposed. In this state, the second pattern 131b is formed in synchronism with a second wiring. Thus, in this embodiment, the first and second patterns 131a, 131b are laminated to each other directly without intervention of the first insulation film 132a, so the distortion of pattern caused by the interposition of an insulating film is relatively prevented.

After formation of the second pattern 131b, a second insulating film 132b is formed again by a photoresist process, then it is partially removed and exposed by etching. Thereafter, a third pattern is formed on the second pattern 131b in the same procedure as above.

Thus, according to this embodiment, since the first to third patterns 131a–131c are laminated together directly without the interposition of insulating films, even the third pattern 131c has edges of relatively reduced distortion in which are reflected the shapes of the underlying first and second patterns 131a, 131b.

The alignment procedure using the thus-formed alignment pattern 103 (the third pattern) will be described below. Although the alignment pattern 108 in FIGS. 12 to 14 is shown in a simplified manner, its sectional shape is about the same as that shown in FIG. 11.

In FIG. 12, the alignment pattern 108 is formed in a symmetric shape, that is, in a distortion-free state, while in FIG. 13, it is formed in an asymmetric shape due to variations in the wafer layer forming processes, for example, unevenness in film thickness of the first and second patterns 131a, 131b in FIG. 11. The alignment pattern 108 in FIG. 12 is broken at its edge portions.

In the case where the alignment pattern 108 is formed in a generally symmetric, ideal state, a high alignment accuracy can be attained by the alignment method of the prior art, that is, even with only a straight line (a vertical illumination light S). In the actual manufacturing process for the wafer 107, however, it is difficult to form the alignment pattern 108 always in a symmetric shape like the above; in many cases, the alignment pattern 108 is asymmetric in section as shown in FIGS. 13 and 14.

The following description of the alignment procedure will first refer to the case where the alignment pattern 108 is formed in a symmetric shape as shown in FIG. 12 and then refer to the case where it is formed in an asymmetric shape as in FIGS. 13 and 14.

When an illumination light is radiated from the illumination light source 111 upon movement of the XY stage 106, it reaches the shutter 123 through the condenser lens 112. Since the illumination aperture of the shutter 123 is moved in the direction of −1 together with the shutter support 125 by the operation of the stepping motor 126 [FIG. 9(b)], the illumination light which has passed through the illumination aperture 122 advances to the optical system for alignment which follows, in an inclined condition by $-\theta$ with respect to the vertical reference optical axis.

The illumination light further passes through the relay lens 115 and the chromatic aberration correcting lens group 116. At this stage the illumination light is corrected its chromatic aberration caused by a continuous spectrum light, then it is radiated onto the alignment pattern 108 via the reflecting mirror 117 and the reduced projection lens 104.

At this time, the illumination light (R detection light) is applied to the alignment pattern 108 in a displaced condition with respect to the vertical reference optical axis by the movement of the shutter 123 on the optical path of the light. It is FIG. 12(a) that shows this state. According to the same figure, the illumination light is radiated as R detection light obliquely from above at an inclination angle of $-\theta$ with respect to the vertical reference optical axis in the alignment pattern 108.

Figure 12A:
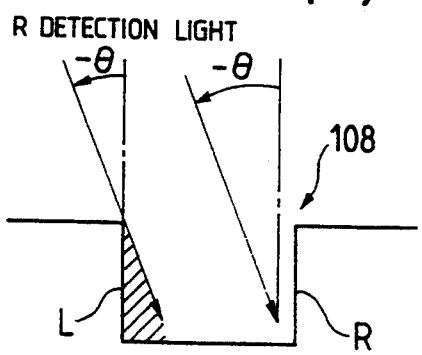
FIGS. 12(a) to 12(f), FIGS. 13(a) to 13(f), and FIGS. 14(a) to 14(f) are explanatory views showing pattern detecting methods used in the embodiment-2(I)
Figure 12B:
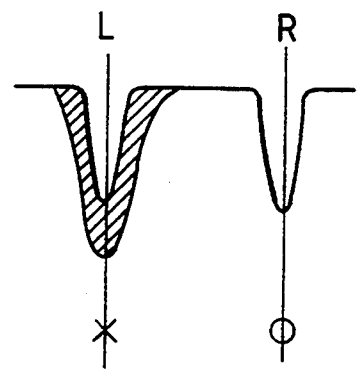

The reflected light from the alignment pattern 108 which received the R detection light travels backward through the optical path of the R detection light in the manner described above and is incident on the TV camera 121, in which it is subjected to an optoelectro conversion into an electric signal of such a wave form as shown in FIG. 12(b). In this figure, the trough portions of the signal wave form correspond to the edge positions of the alignment pattern 108. By reading this coordinates it is made possible to recognize the edge positions on the L ($X_L$) and R ($X_R$) sides of the alignment pattern 108.

As is seen from the same figure, the R detection light having such inclination angle $-\theta$ is shaded by the left-hand edge L of the alignment pattern 108 shown in (a) of the same figure, which shaded portion influences the waveform signal, making it impossible to detect an exact edge position $X_L$ on the left-hand side (L). On the other hand, in the detected edge wave form on the right-hand side (R) there is contained no noise component such as shading of illumination caused by the edge R, so it is possible to detect the R edge position $X_R$ accurately. Therefore, where the edge position detection is performed using R detection light, only the R edge position data $X_R$ is adopted and the L edge position data $X_L$ containing noise component is not used.

Figure 9D:
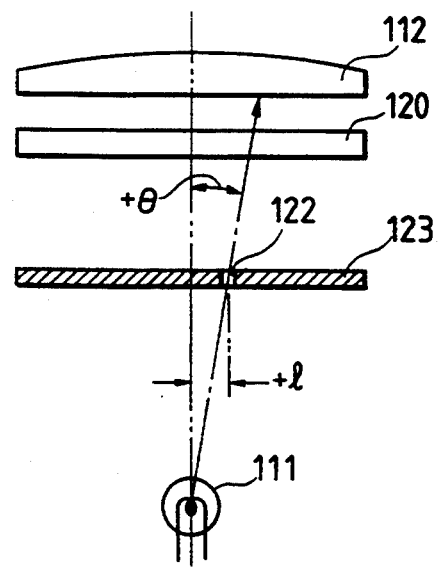

Next, when the shutter 123 assumes the position of +1 with further rotation of the stepping motor 126 [FIG. 9(d)], the illumination light travels on its optical path at an inclination angle of $+\theta$ with respect to the vertical reference optical axis and is applied onto the alignment pattern 108. At this time, as shown in FIG. 12(e), the illumination light is now an L detection light inclined by $+\theta$ with respect to the reference axis in the alignment pattern 108.

Figure 12C:
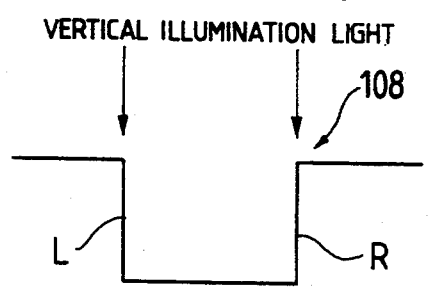
Figure 12D:
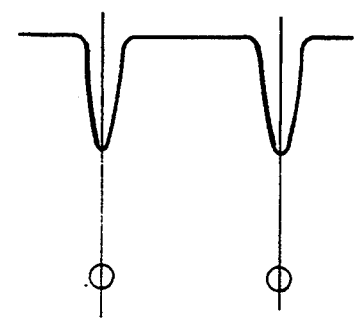
Figure 12E:
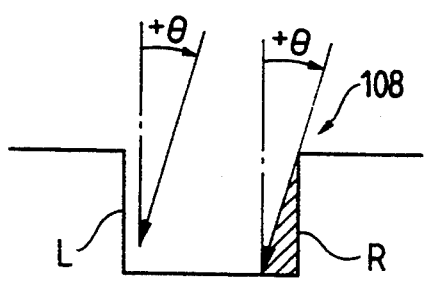
Figure 12F:
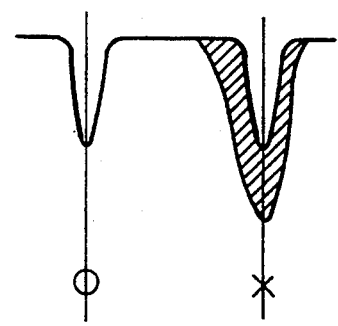

It is FIG. 12(f) that shows the wave form thereby detected. From this figure it is seen that the detection of R edge position $X_R$ is difficult due to noise component under the influence of shading, but the detection of L edge position $X_L$ can be done accurately and surely because the left-hand-side signal waveform contains no noise component induced by illumination shading of the edge L.

Also in this case, only L edge position data $X_L$ obtained by L detection light is adopted and R edge position data $X_R$ containing noise component is not used.

Thus, in this embodiment, detection lights (R and L detection lights) having most suitable inclination angles ($\pm\theta$) are used to detect R and L edge positions $X_R$, $X_L$, respectively.

When the shutter 123 assumes the $\pm\theta$ position with rotation of the stepping motor 126, that is, when the illumination aperture is positioned on the vertical reference optical axis, the illumination light serves as the vertical illumination light S like the prior art. As shown in FIGS. 12(a), (c) and (e), by the radiation of the vertical illumination light S alone, it is possible to accurately detect both R and L edge positions ($X_L$, $X_R$) as long as the alignment pattern 108 is formed in an ideal state, that is, formed highly accurately in a symmetrical sectional shape.

However, where the sectional shape of the alignment pattern 108 is asymmetric, it is in many cases difficult to effect an accurate position detection from the detected signal wave form recognized by the TV camera 121 because the reflected light contains noise component due to the influence of irregular reflection, etc.

Figure 13C:
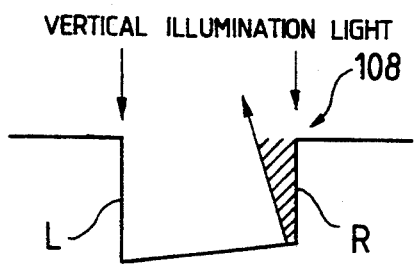
Figure 13D:
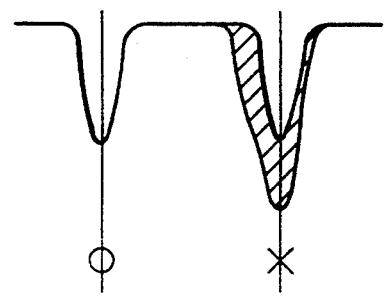

When the sectional shape of the alignment pattern 108 is asymmetric, the alignment technique of this embodiment is most effective in the following case.

Where the bottom of the alignment pattern 108 is inclined at an angle of say 2 to 5 degrees as shown in FIG. 13, the use of such a vertical illumination light S as shown in FIG. 13(c) causes noise component to be incorporated in the detected edge waveform on the right-hand side as shown in (d) of the same figure.

On this regard, this embodiment employs the R detection light described above, whereby the detection of R edge position ($X_R$) can be done accurately as shown in FIG. 13(a). With the vertical illumination light S in the prior art, as shown in FIG. 13(c), the reflected light from the inclined bottom is incorporated in the detected edge waveform on the right-hand side, so it is difficult to effect an accurate detection of R edge position [FIG. 13(d)].

Figure 13E:
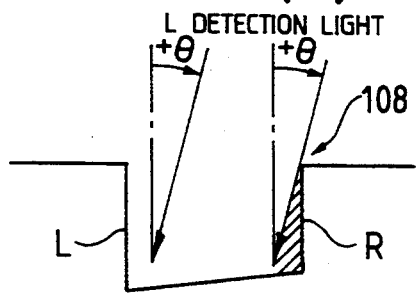
Figure 13F:
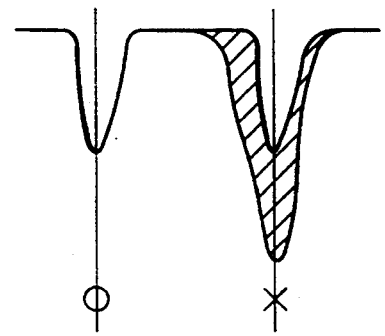
Figure 14A:
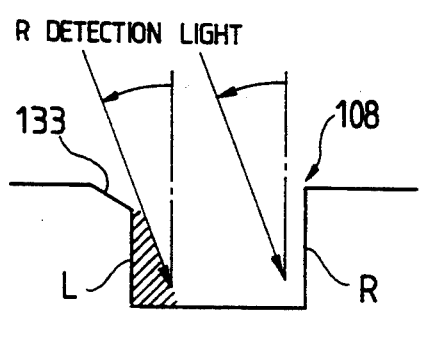
Figure 14B:
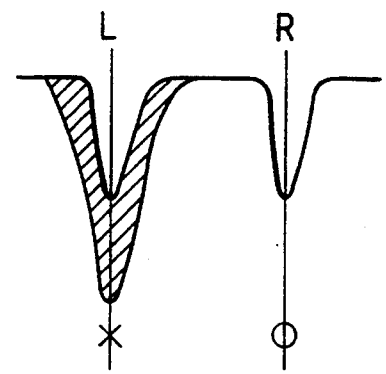

On the other hand, in the detection of L edge position, it is possible to effect the said detection accurately by using L detection light having an inclination angle of $+\theta$, as shown in FIGS. 13(e) and 13(f), likewise, in the detection of R edge position, it is possible to effect the said detection accurately by using R detection light having an inclination angle of $-\theta$, as shown in (a) and (c) of the same figure.

The incorporation of noise component in the detected edge waveform is caused not only by such inclined bottom of the alignment pattern as in FIG. 13 but also by a droop surface 133 of a corner of the stepped portion.

Figure 14C:
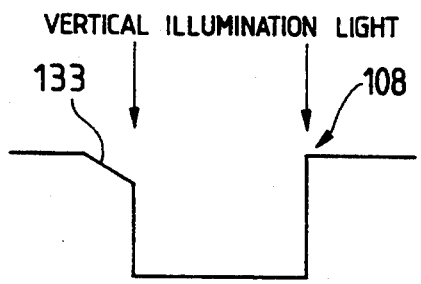
Figure 14D:
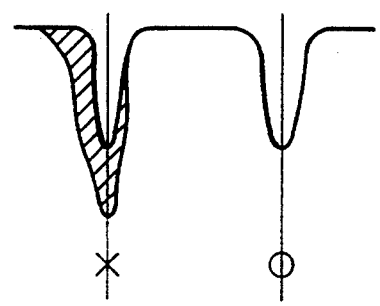
Figure 14E:
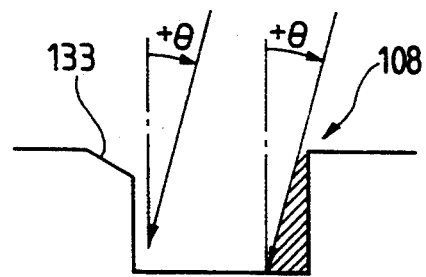
Figure 14F:
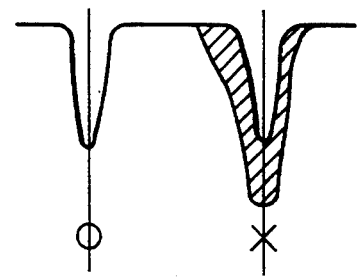
Figure 15A:
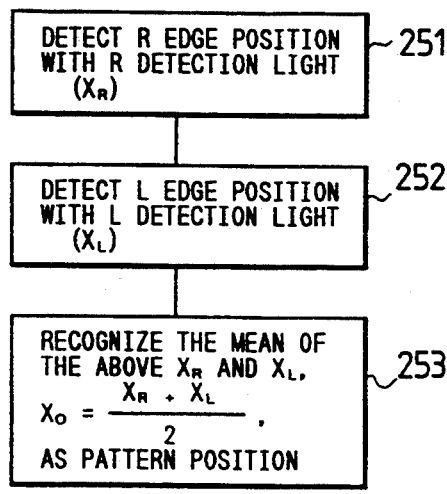
FIGS. 15(a) and 15(b) are flow charts each showing a signal processing procedure in the pattern detection of the embodiment-2(I)
Figure 15B:
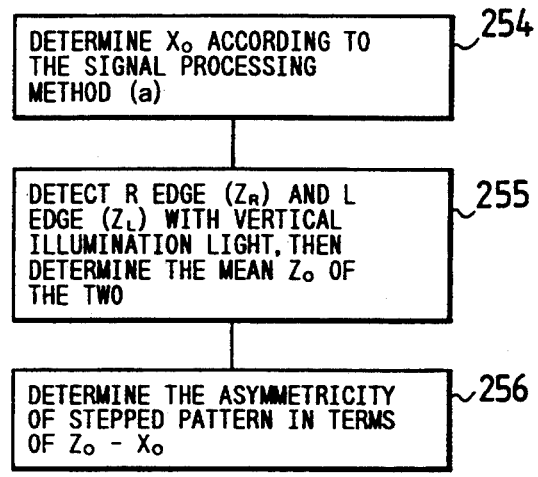

More specifically, when the vertical illumination light S is radiated to an alignment pattern 108 having the droop surface 133, as shown in FIG. 14(c), noise component is incorporated in the detected edge waveform on the left-hand side where the droop surface 133 is present as shown in (d) of the same figure, thus making it difficult to effect an accurate detection of L edge position.

Even in such a case, according to this embodiment, it becomes possible to effect an accurate detection of R edge position $X_R$ by using the R detection light shown in FIG. 14(a), while by using L detection light it is possible to detect L edge position $X_L$ accurately. Thus, by using R edge position data $X_R$ obtained using R detection light and L edge position data $X_L$ obtained using L detection light, it is possible to detect both R and L edge positions accurately without being influenced by irregular reflection from the droop surface 133.

The edge detecting operation described above will be explained below using the flowchart of FIG. 15(a) at the level of signal processing.

First, R edge position is detected using R detection light and the detected position coordinates are designated $X_R$ [step 251 in FIG. 15(a)]. At this time, L edge position data are not adopted.

Next, L edge position is detected using L detection light and the detected position coordinates are designated $X_L$ (step 252). In this case, R edge position data are not adopted.

Average coordinates of $X_R$ and $X_L$ thus obtained are calculated and the result is recognized as reference pattern position coordinates $X_o$ (step 253).

The following description is now provided about detecting asymmetricity of the alignment pattern 108 using the R detection light, vertical illumination light S and L detection light described above.

First, $X_o$ is determined by the signal processing of FIG. 15(a) (step 254), then the vertical illumination light S shown in FIGS. 12(c) and 13(c) is radiated to the alignment pattern 108 to obtain R detected R and L position coordinates ($Z_R$, $Z_L$), and thereafter calculation is made to obtain a mean value, $Z_o$, of the two. Of course, since either the coordinates $Z_R$ or $Z_L$ (R or L edge position data) obtained contains noise component as explained above, the mean value $Z_o$ obtained therefrom is not a true value.

Then, the $X_o$ obtained in step 253 is subtracted from the $Z_o$ to calculate $\Delta Z$ (step 256) which represents the deviation of $Z_o$ from a true reference pattern position coordinates $XO_o$. In the subsequent alignment processing, therefore, by adding $\Delta Z$ as the amount of correction to the $Z_o$ obtained using the vertical illumination light S, there can be obtained a true reference pattern position coordinates $X_o$ without using R and L detection lights.

Thus, in this embodiment, once the reference pattern position coordinates $X_o$ are obtained using R and 10 L detection lights, then in the subsequent alignment operations it is possible to recognize the pattern position accurately with respect to each alignment pattern 108 by a mere arithmetic processing of adding the amount of correction $\Delta Z$ to the value detected using the vertical illumination light S.

Figure 16:
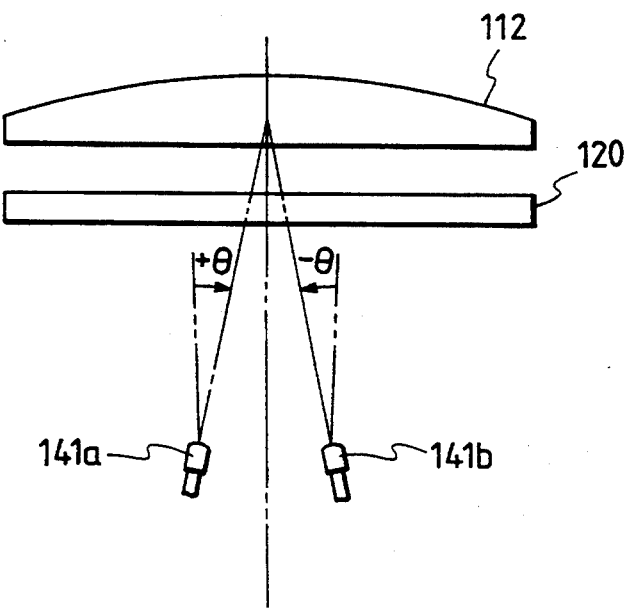
FIG. 16 is a partial system diagram showing the arrangement of illumination sources used in a reduced projection exposure system according to an embodiment-2(II) of the present invention.
Figure 17A:
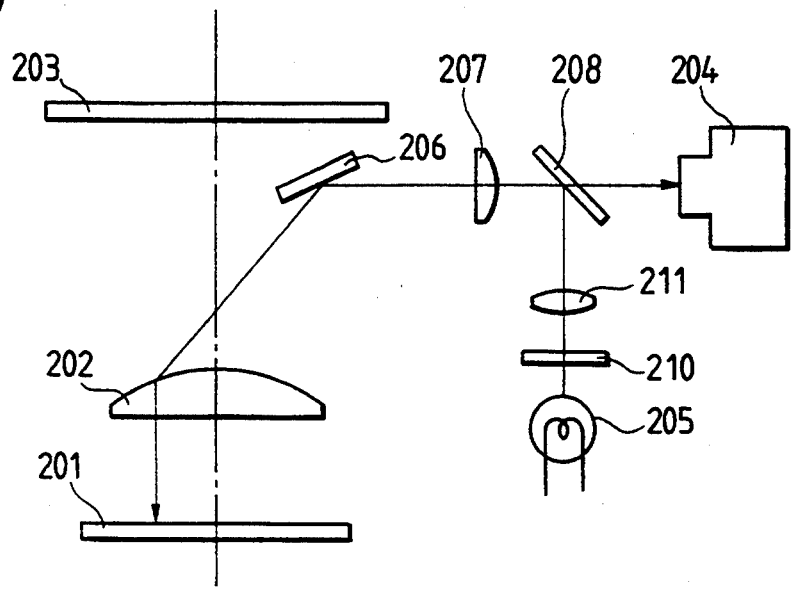
FIG. 17(a) is a system diagram for explaining the alignment technique according to the TTL method used in the prior art.
Figure 17B:
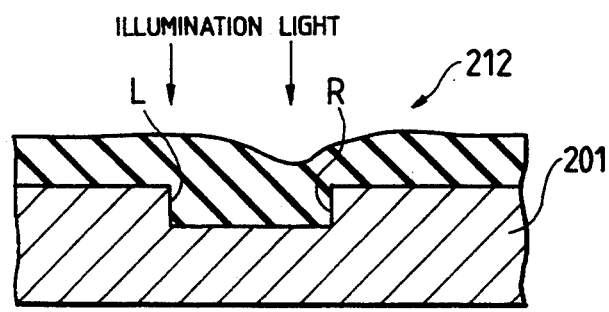
FIGS. 17(b) and 17(c) are a partial sectional view for explaining a formed state of an alignment pattern in the prior art and a view of the resulting signal waveform, respectively.
Figure 17C:
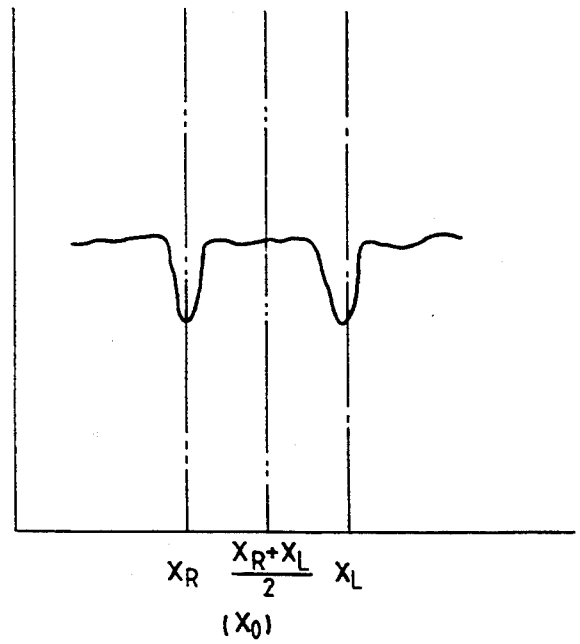

FIG. 16 is a partial system diagram showing the arrangement of illumination light sources used in a reduced projection exposure system according to embodiment-2(II) of the present invention.

In this embodiment-2(II), the optical axis moving described in the above embodiment-2(I) is not used, but instead two illumination light sources are provided to obtain the same effects as in the embodiment-2(I).

More specifically, a first illumination light source 141a is disposed so that the light emitted therefrom is applied to the alignment pattern 108 as a detection light R at an angle of $+\theta$ with respect to the vertical reference optical axis, while a second illumination light source 141b is disposed so that the light emitted therefrom is applied to the alignment pattern 108 as a detection light L at an angle of $-\theta$ relative to the vertical reference optical axis.

The first and second illumination light sources 141a, 141b may be of the same construction as in the previous embodiment-2(I) wherein the light emitted from the exposure light source 102 is conducted to the illumination light source through the optical fiber 118. Or they may each comprise an independent light source.

In this embodiment there can be obtained the same R and L detection lights as in the embodiment-2(I) by changing over between the first and second illumination light sources 141a, 141b, thus permitting an accurate edge position detection.

Although the present invention has been described concretely in terms of embodiments, it goes without saying that the invention is not limited thereto and that various modifications may be made within the range not departing from the gist of the invention.

For example, although in the embodiment-2(I) there was used as a component of the illumination light source 111 the optical fiber 118 for conducting the light of the mercury lamp as the exposure light source 102 to the illumination light source, there may be used a xenon lamp or any other suitable lamp which is independent as the illumination light source 111. By using a xenon lamp which emits a relatively uniform light energy at various wave lengths, it becomes possible to adopt a continuous spectrum light selectively with the result that it is possible to effect a high accuracy pattern detection free of interference fringe.

Although in the above description the present invention was applied to the alignment technique in the so-called reduced projection exposure as a utilization field of the invention, this constitutes no limitation and the invention is applicable also to the photo mask-wafer alignment technique in a 1:1 magnification exposure for example.

Typical effects attained by the above embodiments-2(I) and -2(II) will be described below briefly.

By radiating the illumination light at a predetermined inclination angle relative to the vertical reference optical axis for a pattern, it becomes possible to accurately detect the position of one of both edges of the pattern. Therefore, by repeating radiation of the illumination light to the pattern while varying such inclination angle, it becomes possible to effect an accurate position detection even in the case of a distorted pattern, namely, a pattern asymmetric in section, thus permitting enhancement of the alignment accuracy.

Further, the first coordinate value obtained by the radiation of detection light in the inclined direction and the second coordinate value obtained using the vertical illumination light are compared with each other to calculate the amount of correction, whereby the amount of deviation in the detection using the vertical illumination light becomes clear. Therefore, in the subsequent position detecting operations, it is possible to conduct an efficient alignment processing by correcting data obtained using only the vertical illumination light.

(3) Embodiment-3

Figure 18:
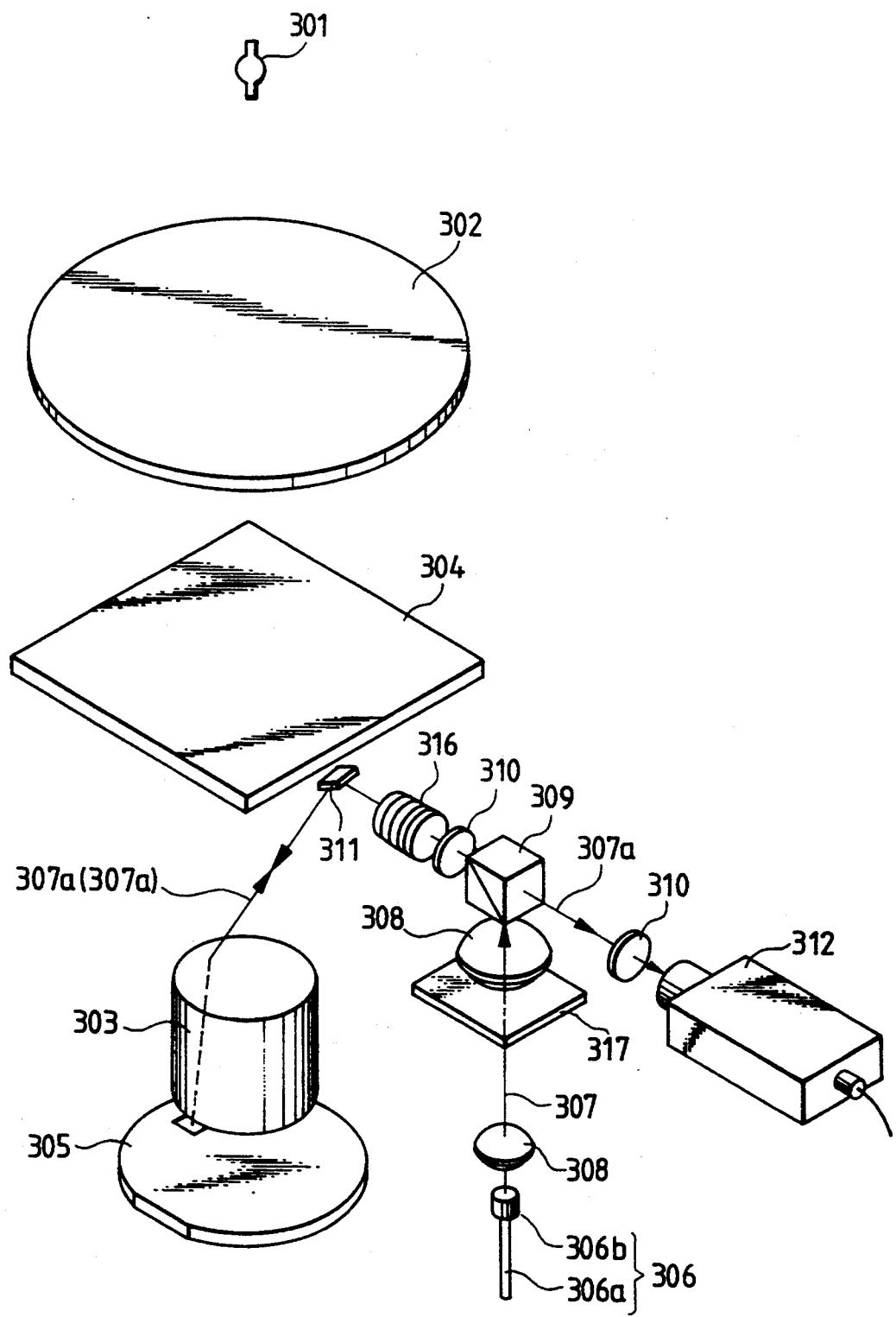
FIG. 18 is a perspective view showing principal components of a reduced projection exposure system having an alignment device according to an embodiment-3 of the present invention.
Figure 19:
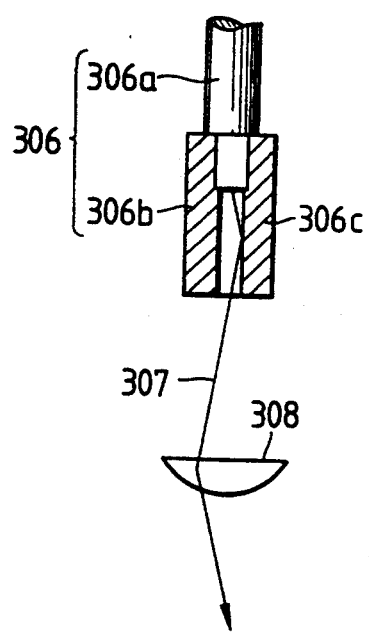
FIG. 19 is an explanatory view showing an illumination light source portion used therein.
Figure 20:
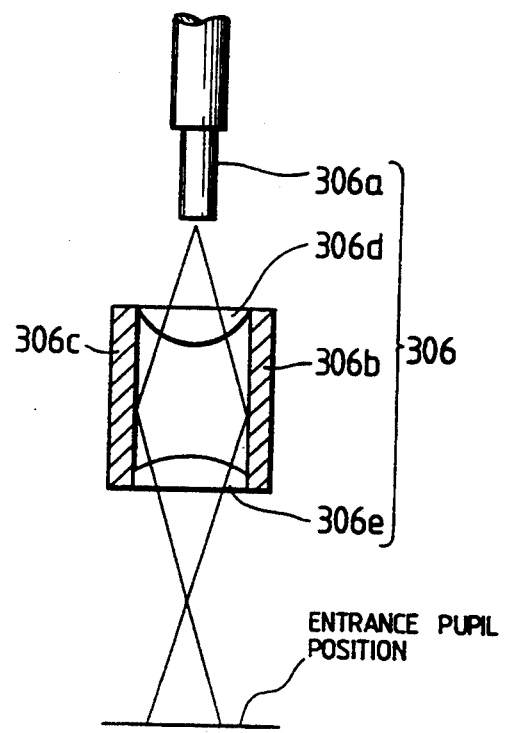
FIG. 20 is an explanatory view showing a modified illumination light source.

FIG. 18 is a perspective view showing principal components of a reduced projection exposure system having an alignment device according to embodiment-3 of the present invention; FIGS. 19 and 20 are explanatory views showing a light source portion used therein.

The reduced projection exposure system of this embodiment is provided with an optical exposure system comprising an exposure light source 301 which comprises a mercury lamp for example, a condenser lens 302 for condensing the exposure light emitted from the exposure light source 301, and a reduced projection lens 303.

As to the mercury lamp and the reduced stepping projection aligner, reference is here made, in place of description herein, to Ichiro Hoko, "Semiconductor Lithography Technique," the second edition, Sankyo Tosho K.K. (May 30, 1986), pp. 81–102.

Between the condenser lens 302 and the reduced projection lens 303 is removably disposed a master plate 304 such as a reticle fabricated by coating a transparent glass substrate or the like with a light shielding film of a desired integrated circuit pattern enlarged to a predetermined magnification (e.g. 5×).

Under the reduced projection lens 303 is located a semiconductor wafer 305 (an object to be exposed) which is placed on an X-Y stage movably in a horizontal plane and which has been coated on the surface thereof with a photoresist film 305a, for example, by a rotational application technique in the preceding application process.

The exposure light emitted from the exposure light source 301 and passed through the master plate 304 is reduced to a predetermined magnification (e.g. 1/5) by the reduced projection lens 303 and then projected onto the semiconductor wafer 305, whereby the photoresist film 305a formed on the surface of the wafer is exposed to the integrated circuit pattern of the actual size.

Near the above optical exposure system is disposed an illumination light source 306, which emits an illumination light 307. The illumination light 307 passes through a condenser lens 308 and is reflected at a predetermined angle by a half mirror 309, then reaches the reduced projection lens 303 via a relay lens 310, a chromatic aberration correcting lens group 316 and a reflecting mirror 311; further, through the reduced projection lens 303 the illumination light illuminates a predetermined part of the wafer 305.

In this embodiment, the illumination light source 306 includes a light conducting means such as an optical fiber 306a for conducting light from the exposure light source lamp. On the optical path of the illumination light is disposed a band pass filter 317 to permit only E-line ($\Delta = 546$ nm) and D-line ($\Delta = 589$ nm) to pass therethrough out of the wave lengths of light emitted from the mercury lamp as the exposure light source lamp. The illumination light which has passed through the band pass filter 317 is incident on the half mirror 309 as a continuous spectrum light in a visible light range. The use of such a continuous spectrum light is advantageous in preventing an interference fringe caused by the use of a monochromatic light, thereby enhancing the detection accuracy.

The illumination light 307 radiated onto the wafer 305 via the half mirror 309, chromatic aberration correcting lens group 316, reflecting mirror 311 and reduced projection lens 303 illuminates a predetermined alignment pattern formed on the wafer, then as the reflected light it travels backward through the optical path thereof and is received by a TV camera 312.

The TV camera 312 is connected to a signal processor through a signal cable 312a, and the position of an alignment mark 305b is determined by calculation on the basis of the wave form of a detected signal provided from the TV camera 312 and reflecting the shape of the alignment mark 305b.

The illumination light source 306, as shown in FIG. 19, comprises the optical fiber 306a (a multi-spot light source) for conducting a desired wave length light as the illumination light 307 out of a light source such as a mercury lamp, and a cylindrical mirror 306b (reflecting means) which is coaxially mounted on an end portion of the optical fiber 306a and whose inner peripheral surface is a mirror surface 306c formed by a cylindrical or conical surface. The illumination light 307 radiated and diffused from the end portion of the optical fiber 306a is reflected to the optical axis side by the inner peripheral surface of the cylindrical mirror 306b and then radiated to the exterior.

As to the cylindrical mirror used herein, reference is here made, in place of description herein, to Shiba et al's Japanese Patent Laid-Open No. 251858/86 (laid open Nov. 8, 1986, filed May 1, 1985 as Application No. 92302/85) in which is shown an example of application of the cylindrical mirror to an illumination system in an optical exposure system.

Figure 21:
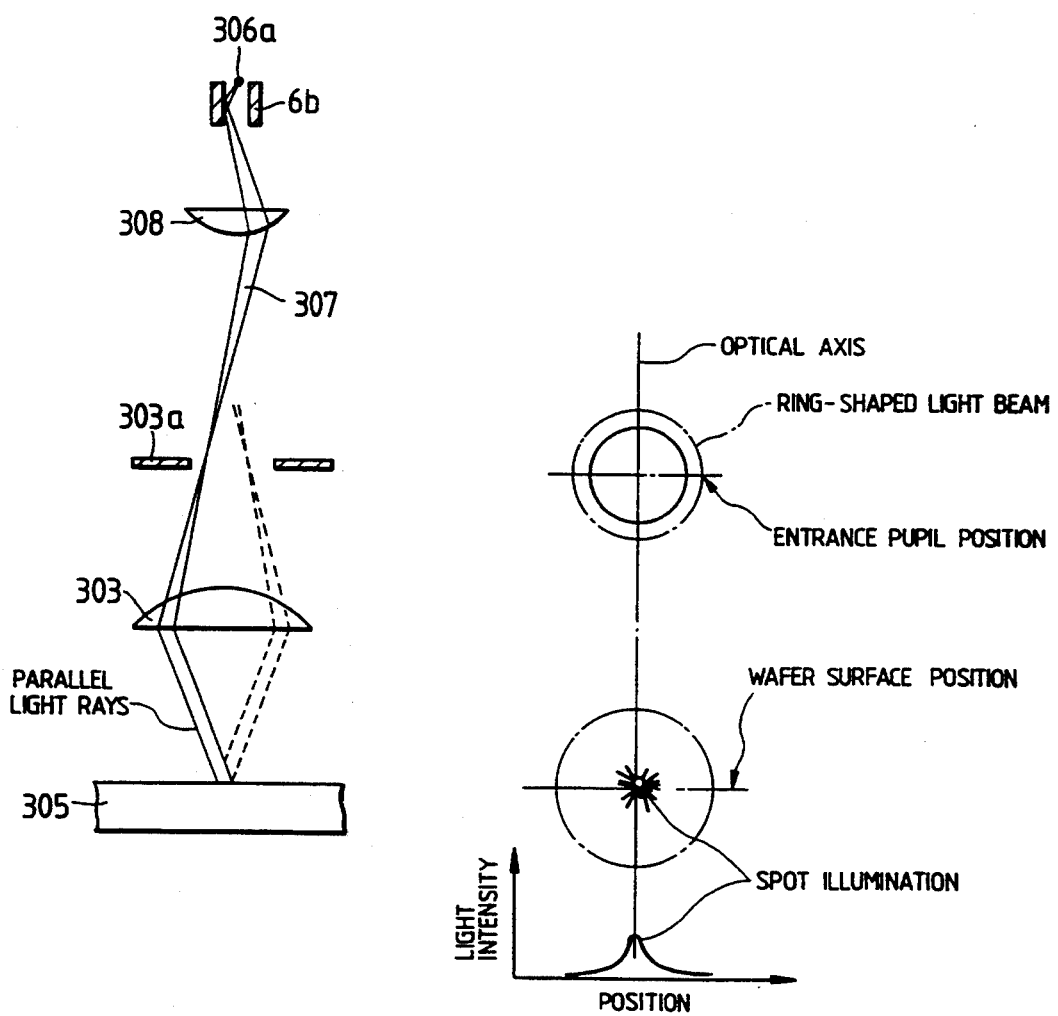
FIG. 21 is a view explanatory of the principle of non-Koehler illumination.
Figure 24:
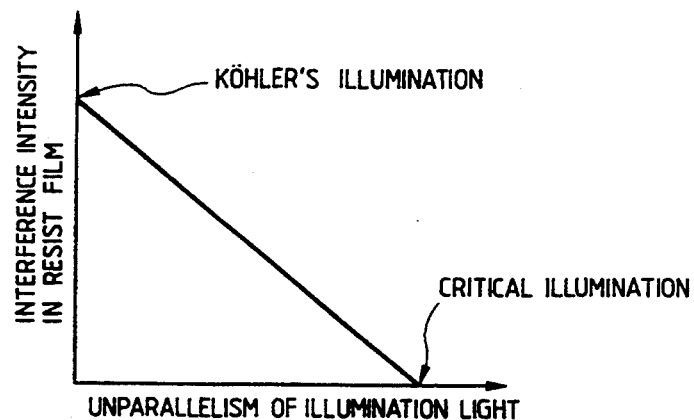
FIG. 24 is a diagram showing changes in interference intensity in a photoresist film in Koehler illumination and critical illumination.
Figure 25:
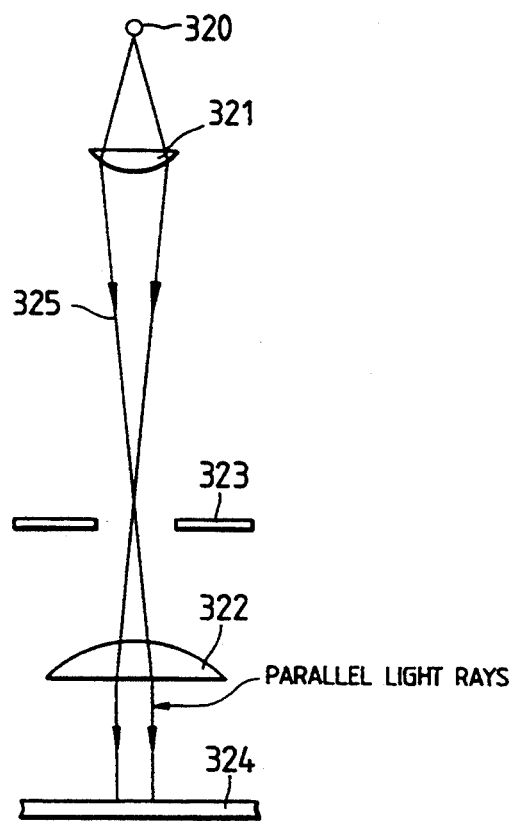
FIG. 25 is a principle diagram of Koehler illumination.
Figure 26:
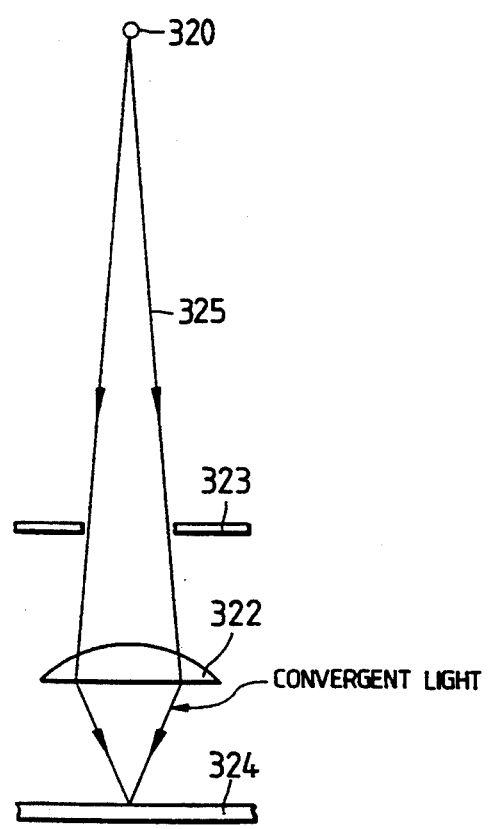
FIG. 26 is a principle diagram of critical illumination.

In this embodiment, as shown in FIG. 21, the illumiantion light 307 radiated from the optical fiber 306a is reflected by the inner peripheral surface of the cylindrical mirror 306b, whereby it becomes a ring-shaped light beam in the position of an entrance pupil 303a of the reduced projection lens 303. And there is performed a non-Köler's illumination wherein a desired area of the semiconductor wafer 305 is irradiated in a spot form with an incoherent illumination light 7 comprising unparallel light rays.

The operation of this embodiment will be described below.

First, the X-Y stage is moved to make adjustment so that the illumination light 307 radiated from the optical fiber 306a of the illumination light source 306 and applied to the semiconductor wafer 305 via the cylindrical mirror 306b, condenser lens 308, beam splitter 309, relay lens 310, reflecting mirror 311 and reduced projection lens 303, is directed to the alignment mark 305b formed on a predetermined part of the wafer 305.

Figure 22:
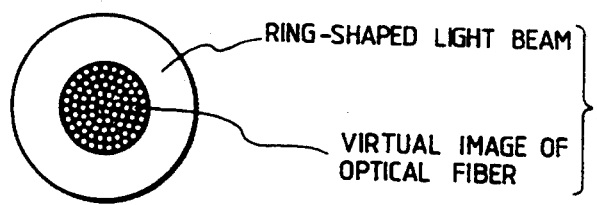
FIG. 22 is a view showing a virtual image in the position of an entrance pupil of a reduced projection lens.

At this time, according to this embodiment, a sectional image of the optical fiber 306a of the illumination light source 306 and a "virtual image" of the illumination light source 306 comprising a ring-shaped light beam which surrounds the said sectional image, are formed in the position of the entrance pupil 303a of the reduced projection lens 303, as shown in FIG. 22, and the illumination light 307 which illuminates the alignment mark 305b on the surface of the semiconductor wafer 305 becomes an unparallel light beam and incoherent.

Consequently, the intensity of interference fringe of the illumination light 307 in the transparent photoresist film 305a formed on the surface of the wafer 305 becomes smaller, and the illumination light is reflected from the surface of the alignment mark 305b formed unevenly on the wafer surface, so that the reflected light, indicated at 307a, which reflects the shape of the alignment mark 305b is applied to the TV camera 312.

As a result, there is obtained a detection signal which clearly reflects the shape of the alignment mark 305b, like a detection signal A indicated by a solid line in the diagram of FIG. 23. For example, by detecting minimal points of the detection signal A corresponding to the stepped portions of the alignment mark 305b and calculating a middle point thereof, it is possible to grasp the position of the alignment mark 305b accurately.

Consequently, the alignment of a desired part of the semiconductor wafer 305 relative to the master plate 304 can be done with a high accuracy on the basis of the position of the alignment mark 305b, thus permitting improvement of the alignment accuracy.

On the other hand, in the conventional Köler's illumination wherein the illumination light 307 is radiated as parallel light rays to the semiconductor wafer 305, there occurs a strong interference fringe in the photoresist film 305a, so that a detection signal B of the interference fringe is incorporated in the detection signal A which reflects the shape of the alignment mark 305b, and there is detected a detection signal C having an indistinct wave form not reflecting the shape of the alignment mark. Consequently, it becomes difficult to accurately grasp the position of the alignment mark 305b and the deterioration in alignment accuracy of the semiconductor wafer 305 relative to the master plate 304 is unavoidable.

And on the basis of the position of the alignment mark 305b which has been grasped accurately, a desired area of the semiconductor wafer 305 is positioned accurately on the optical axis of the optical exposure system, and thereafter the integrated circuit pattern formed on the master plate 304 is transferred onto the photoresist film 305 of the wafer 305 by the exposure light emitted from the exposure light source and passed through the condenser lens 302, master plate 304 and reduced projection lens 303.

(4) Explanation of Light Sources Employable in the Embodiments

Figure 27A:
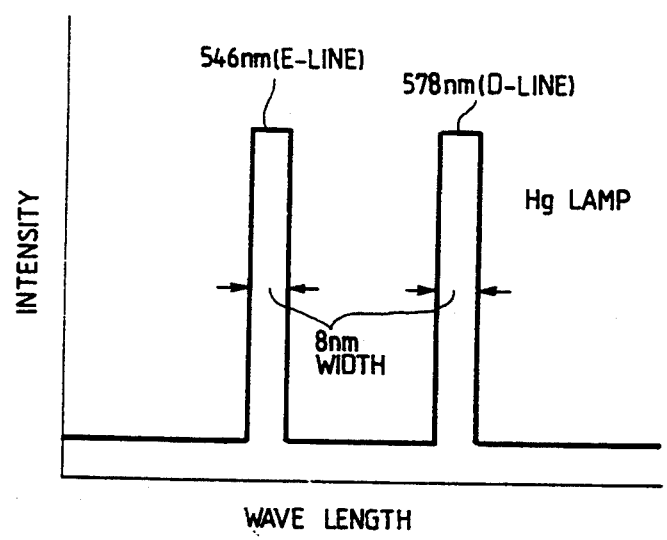
FIGS. 27(a) and 27(b) are schematic wavelength versus light intensity distribution diagrams showing wavelength distributions of a reference light used in chip alignment in the present invention.
Figure 27B:
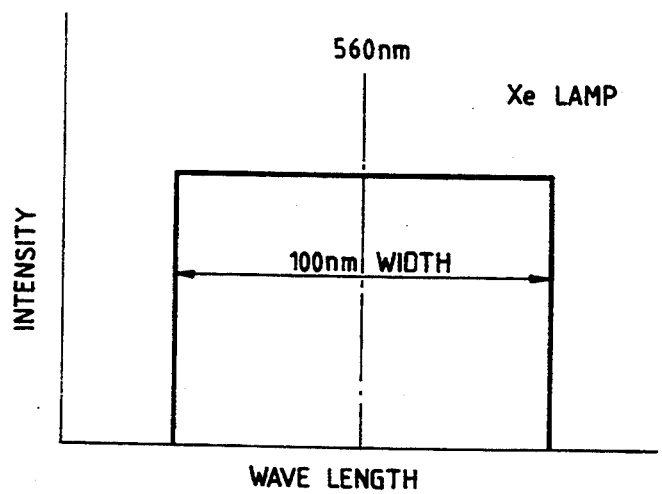

FIGS. 27(a) and 27(b) are each a schematic wave length distribution diagram of a light source for reference suitable for the embodiments of the present invention, (a) using a dichromatic light (E- and D-lines) from a mercury lamp and (b) using a continuous light or "white light", e.g. a visible light ranging from green to orange color, (a 100 nm wide continuous spectrum of mainly 560 nm) from a xenon lamp. These can be suitably selected as necessary.

On the other hand, as to the exposure light, explanation is made about G-line ($\Delta=436$ nm) of a mercury lamp which is a monochromatic light, but as other light sources there are employable mercury lamp's h-line (405 nm) and i-line (365 nm), as well as XeCl line of 308 nm, KrF line of 248 nm, and ArF line of 193 nm using Excimer laser.

(5) Explanation of Alignment Process and Exposure/Manufacturing Process common to the Embodiments Although the following explanation is concerned with embodiment-3 as an example, it is applicable as such to the other embodiments.

A concrete semiconductor integrated circuit manufacturing process as well as the structure and operation of the exposure system, using the technique of the present invention, will be described below.

Figure 28:
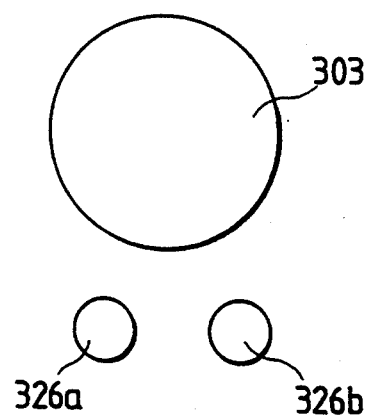
FIG. 28 is a layout plan view of a pair of optical barrels and a projection exposure lens system for off-axis global alignment used in pre-alignment in the invention.

FIG. 28 shows an interrelation between a projection lens barrel 303 (comprising ten-odd lenses) and a pair of optical barrels 326a, 326b for global alignment or pre-alignment.

Figure 29:
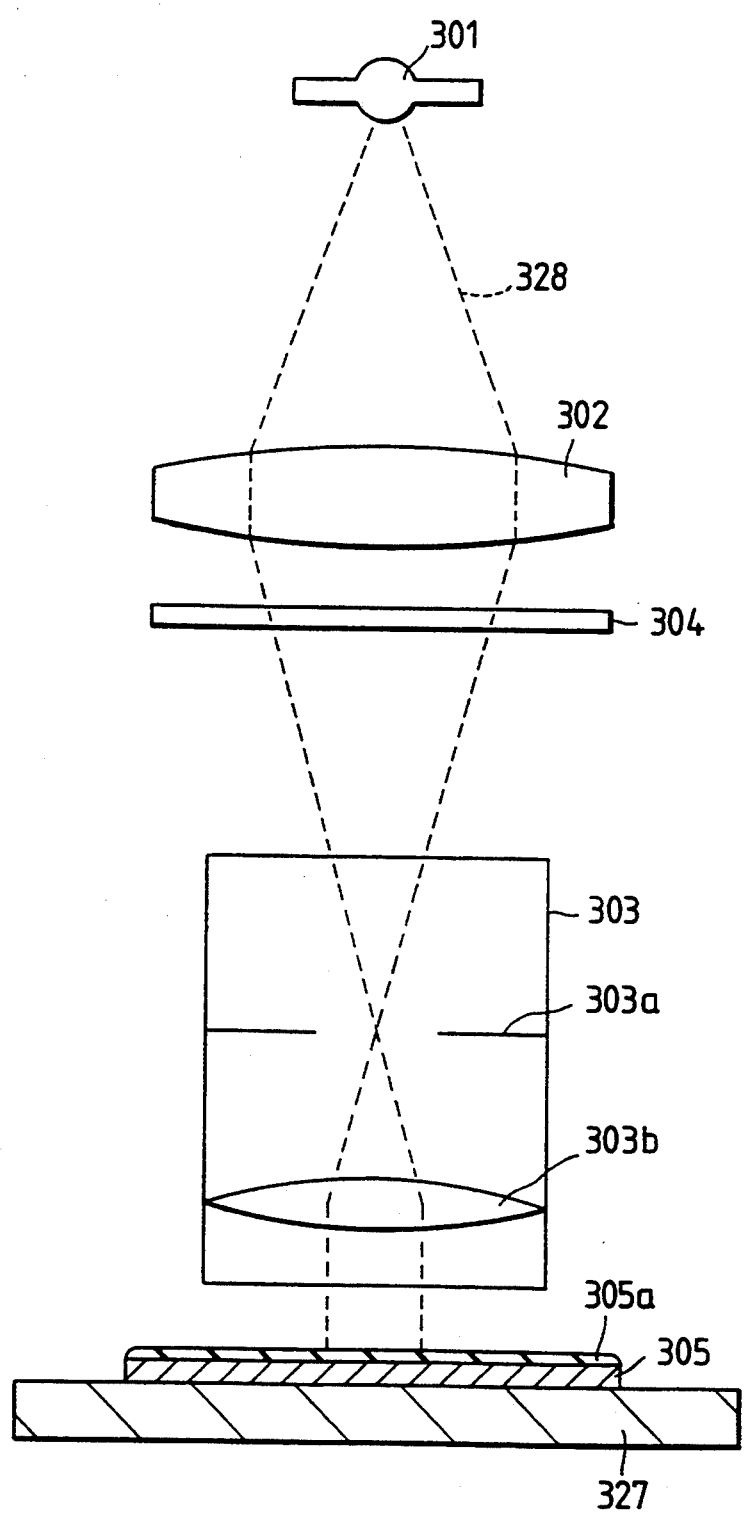
FIG. 29 is a schematic light ray tracing diagram showing a path of a main light ray in an exposed state according to the present invention.

FIG. 29 shows a path of a main light ray in an optical exposure system of the reduced stepping projection exposure system illustrated in FIG. 18. From this figure it can be seen that the wafer side, i.e., the image side, is telecentric.

Figure 35:
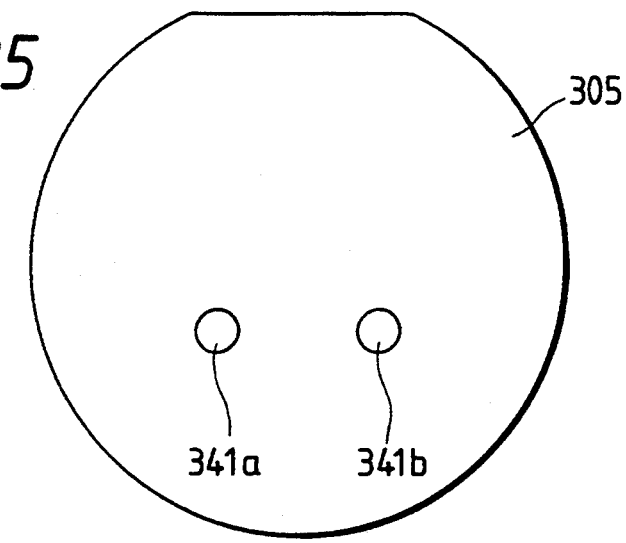
FIG. 35 is a top view of a wafer showing positions of a pair of alignment patterns for global alignment in the invention.

FIG. 35 shows positions of pre-alignment marks (for rough alignment and $\theta$ azimuthal alignment) on a wafer to be processed.

Figure 36:
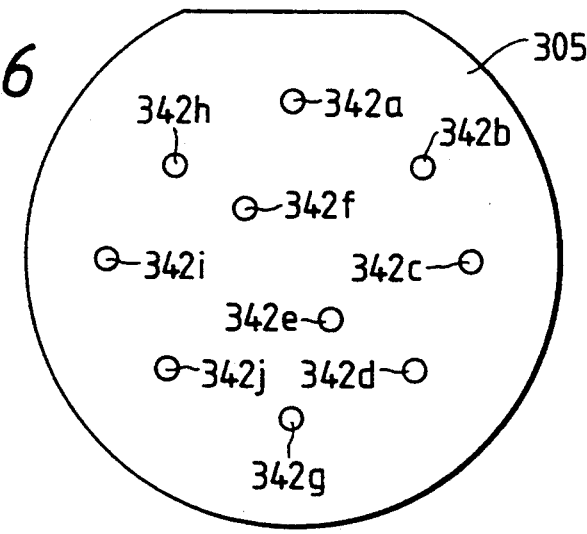
FIG. 36 is a top view of a wafer showing positions of main alignment patterns for chip alignment in the invention.

FIG. 36 shows the arrangement of marks for chip alignment or fine alignment.

Figure 37:
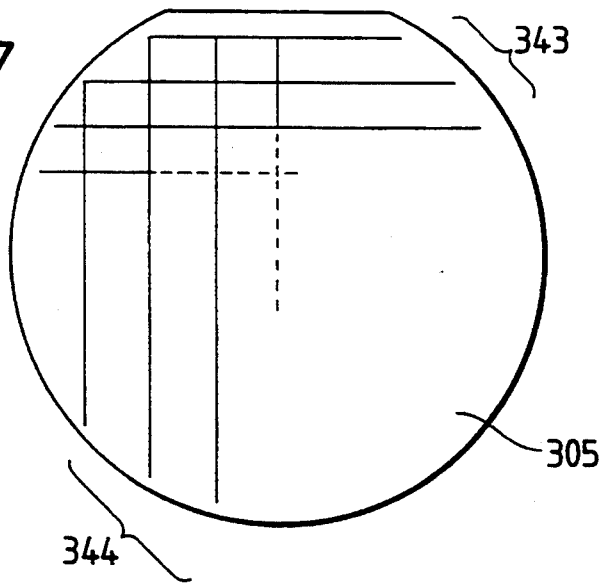
FIG. 37 is a top view of a wafer showing scribing lines on the wafer in the invention.

FIG. 37 shows the arrangement of scribe lines, i.e., street (X direction) and avenue (Y direction), on the device surface on the wafer.

Figure 38:
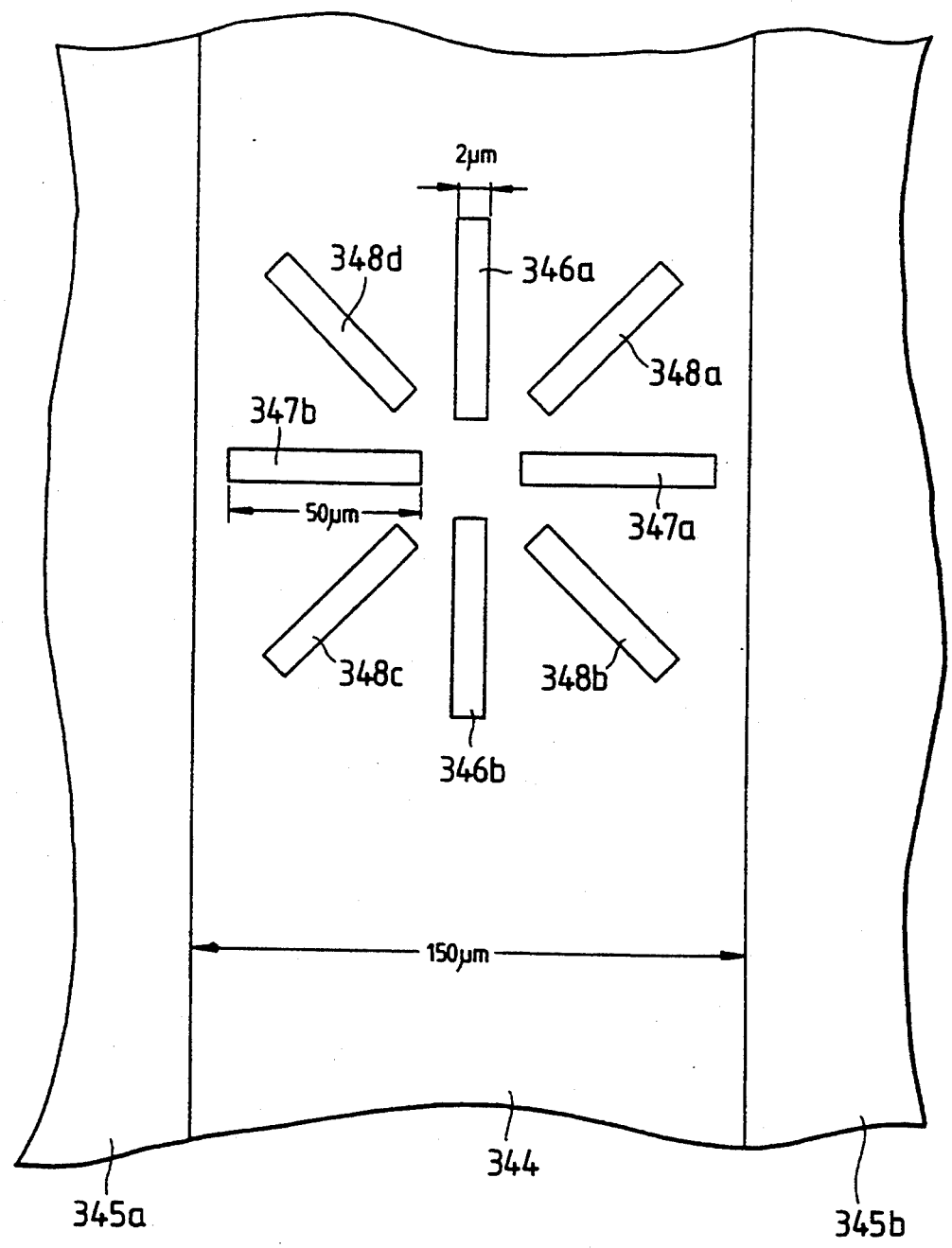
FIG. 38 is a top view of a wafer showing the shape and planar layout of alignment marks for use in both the global and the chip alignment in the invention.

FIG. 38 shows the shape of alignment marks on the scribe lines for use in fine alignment and pre-alignment.

In FIGS. 28, 29, 35 and 38, the lens barrel 303, which is for a reduced projection exposure of 10:1 or 5:1, comprises ten-odd lenses (for monochromatic light of g- or i-line) and can expose an area on the wafer of about 20 mm $\times$ 20 mm to light in one shot. The optical barrels 326a and 326b are for global alignment or for pre-alignment (rough alignment and $\theta$ azimuthal alignment) such as die-by-die or site by site alignment, and they are disposed in positions not coaxial with the projection barrel. The pre-alignment is performed using light which has been rendered resist-insensitive by removing an ultraviolet region using a filter from a visible white light source such as a halogen lamp.

Numeral 301 denotes a mercury lamp as a light source; numeral 302 denotes a condenser lens; numeral 303 denotes a projection lens group (a projection lens barrel); numeral 303a denotes an entrance pupil plane; and numeral 303b denotes an example of a projection lens. Numeral 304 denotes a reticle or a mask; numeral 305 denotes a wafer; numeral 305a denotes a resist film; and numeral 327 denotes an X-Y stage for stepping exposure which is controlled by a laser interferometer. Numeral 328 represents a main light ray passing through the center of the entrance pupil.

Numerals 341a and 341b denote pre-alignment marks on the device surface of the semiconductor wafer; and numerals 342a to 342j denote like marks for chip alignment (fine alignment). All of these marks are of the same shape and their details are illustrated in FIG. 38. These marks are disposed, one for the area of one shot, on the scribe lines (343: street, 344: avenue) throughout the wafer and they are suitably used selectively.

In FIG. 38, the scribe line (avenue) indicated at 344 is about 150 $\mu$m wide; numerals 345a and 345b each denote a chip area; numerals 346a and 346b each denote an alignment pattern element in the X direction, 2 $\mu$m in width and 50 $\mu$m in length; numerals 347a and 347b each denote an alignment pattern element in the Y direction, having the same size as that of the X-pattern elements. Numerals 348a to 348b represent oblique pattern elements.

In FIGS. 30 to 34, numeral 305 denotes a wafer; numeral 330 denotes a LOCOS oxide film; numeral 331 denotes a gate oxide film; numeral 332 denotes a PSG film (first passivation or PSG.I); numeral 333 denotes a first-layer aluminum wiring (Al.I); numeral 333a denotes an aluminum wiring of the same layer as the Al wiring 333, which defines an opening 350 for alignment mark. The alignment mark opening 350 corresponds, for example, to the pattern element 347a shown in FIG. 38. Numeral 334 denotes an inter-layer PSG film (PSG.II) and numeral 335 denotes a positive type photoresist film formed in a thickness of about 1 μm using a spinner. Numeral 336 represents an opening of the resist film for opening a through hole in the PSG.II and also represents the said through hole, and numeral 337 denotes a second-layer aluminum wiring (Al.II).

An explanation of the exposure process will now be given with respect to an example of forming a through hole and a contact hole between the aluminum layers in the two-layer aluminum memory process. The details of the global alignment or pre-alignment method are disclosed in Nakazawa et al's Japanese Patent Laid-Open No. 102823/81 (laid open Aug. 17, 1981), and as to DRAMS's two layer Al process, it is explained in Murata et al's Japanese Patent Application No. 235906/87 (filed Sep. 19, 1987), so reference is here made thereto in place of describing their details herein.

Figure 30:
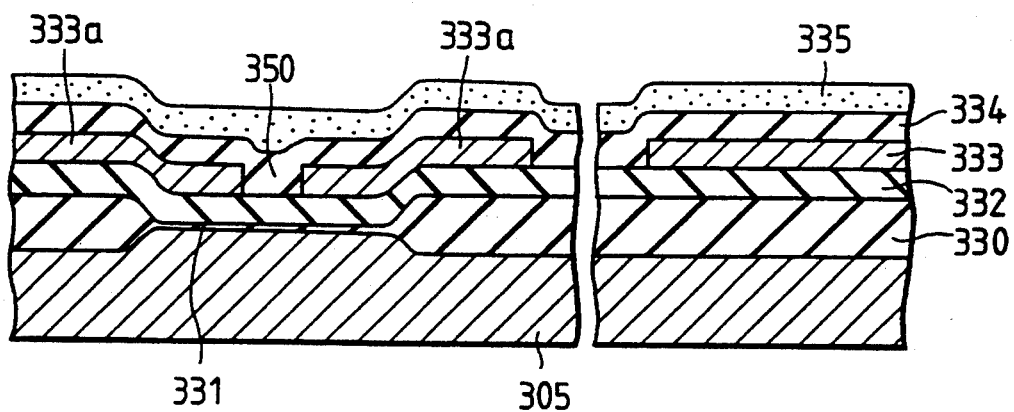
FIGS. 30 to 34 are partial sectional views showing part of the manufacturing process flow for a semiconductor integrated circuit device embodying the invention.
Figure 31:
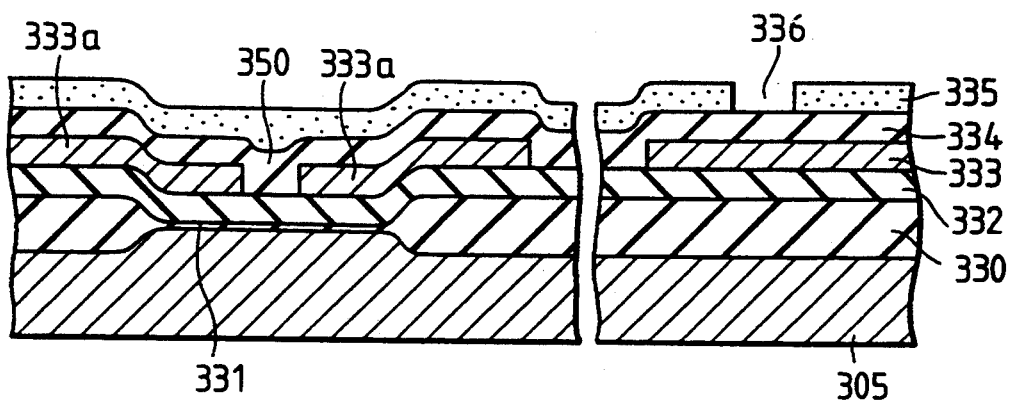

First, a wafer having such a resist film as in FIG. 30 formed throughout the entire surface thereof is placed and attracted onto the X-Y stage 327 so that the orientation flat of the wafer assumes an approximately certain configuration, as shown in FIG. 29. Next, the optical barrels 326a and 326b for global alignment shown in FIG. 28 are brought into alignment with the paired alignment marks 341a and 341b as in FIG. 35, whereby the θ azimuth and the XY position are primary aligned. This will hereinafter be referred to as the "off-axis pre-alignment". (He-Ne laser beam of 543.5 nm is used.)

Subsequently, the XY table is moved to detect the alignment marks 342a–342j (eight to ten marks are selected from among a larger number of alignment marks) shown in FIG. 36 successively using E-line according to the TTL method, as illustrated in FIG. 18. Each detection is effected by seeing the alignment pattern elements 346a (X direction) and 347a (Y direction) shown in FIG. 38 in a bright field. And stepping exposure is performed successively under movement of the stage so that the entire chip alignment deviation becomes optimal on the basis of the multi-spot deviations detected. Exposure is effected in such a manner as shown in FIG. 29.

Figure 32:
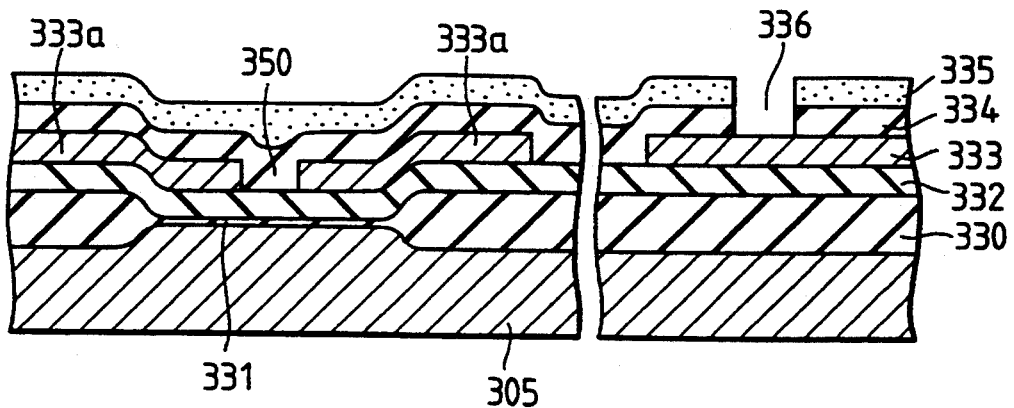
Figure 33:
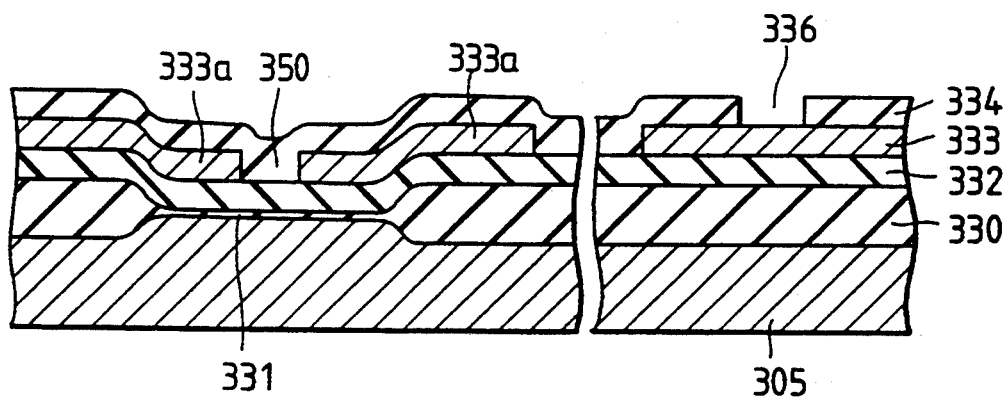
Figure 34:
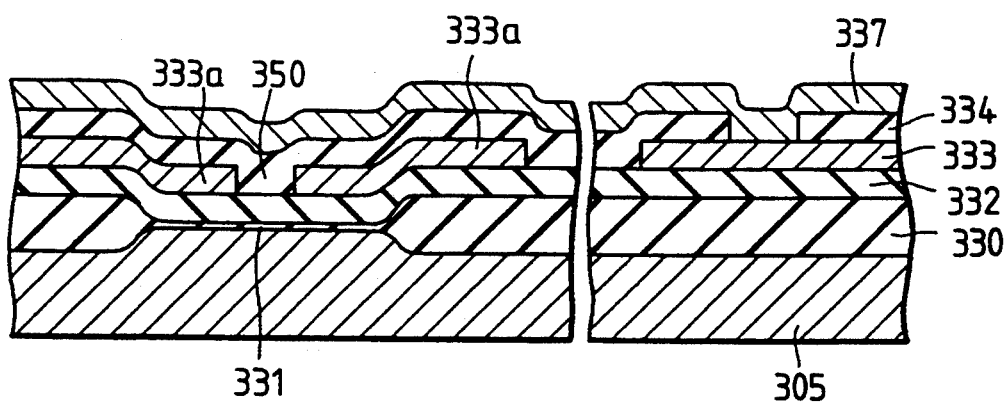

As a result of the exposure, only the resist film area corresponding to the contact hole portion becomes easier to be removed, permitting an opening 336 to be formed. Using this opening, the PSG.II, i.e., 334, is etched selectively, whereby a through hole is formed in a predetermined position of the PSG.II as shown in FIG. 32. Sebsequently, the photoresist film 335 is removed throughout the entire surface thereof and the second-layer aluminum film 337 is formed by sputtering on the whole surface of the PSG.II.

The structure of the illumination light source 306 is not limited to the one shown in FIG. 19. For example, there may be adopted a structure wherein a plurality of condenser lenses 306d, 306e are attached to both end portions of the cylindrical mirror 306b. Also in this case, a ring-shaped light beam is focused on the entrance pupil of the reduced projection lens 303 and the illumiantion for the semiconductor wafer 305 by the illumination light 307 becomes an incoherent non-Köler's illumination, thus permitting the same effects as in the use of the cylindrical mirror 306b to be obtained.

Thus, the following effects can be obtained in this embodiment.

(1) The illumination light source 306 comprises a multi-spot light source such as the optical fiber 306a and the cylindrical mirror 306b having an inner peripheral surface formed by the mirror surface 306c and disposed about the optical axis of the illumination light 307 which is emitted from the optical fiber 306a. The illumunation light 307 which is radiated after being reflected by the cylindrical mirror 306b becomes a ring-shaped light beam in the position of the entrance pupil of the reduced projection lens 303 and illuminates the surface of the semiconductor wafer 305 as non-Köler's illumination of low coherence. Therefore, without formation of a strong interference fringe by the transparent photoresist film 305a formed on the surface of the wafer 305, it is possible to obtain a detection signal A which clearly reflects the shape of the alignment mark 305b on the basis of the reflected light 307a from the same alignment mark, and thus it becomes possible to grasp the position of the alignment mark 305b accurately.

Consequently, the alignment of a desired part of the semiconductor wafer 305 relative to the master plate 304 based on the position of the alignment mark 305b can be effected with a high accuracy, thus permitting improvement of the alignment accuracy.

(2) As a result of the above effect (1), the integrated circuit patterns formed laminatedly on the semiconductor wafer 305 can be improved in their overlapping accuracy, thus permitting improvement in yield of the semiconductor device.

(3) As a result of the above effects (1) and (2), the productivity in the wafer processing step in the production of the semiconductor device can be improved.

It goes without saying that the present invention is not limited to this embodiment and that various modifications may be made within the range not departing from the gist of the invention.

For example, the reflecting means is not limited to a cylindrical mirror; it may be of any other shape, e.g. prismatic or pyramidal shape.

Further, the optical fiber of the illumination light source may be connected to the exposure light source to utilize part of the exposure light as the illumiantion light.

Although in the above description the present invention was applied to the alignment technique in the reduced projection exposure which is a background utilization field of the invention, the invention is not limited thereto but is widely applicable to the alignment technique in general reduced projection exposure.

According to this embodiment, the alignment apparatus in reduced projection exposure is provided with a light source and a reflecting means for reflecting illumination light emitted from the light source toward the optical axis of the illumination light, the reflecting means being disposed around the said optical axis, in which an alignment mark formed unevenly on an object to be exposed is detected its position by non-Köler's illumination involving radiation of the said illumination light comprising unparallel light rays to the said alignment mark. Consequently, the illumination light applied to the alignment mark formed on the object to be exposed becomes incoherent, so that, for example, in a transparent photoresist layer formed in an irregular thickness on the surface of the object to be exposed, the formation of a complicated and strong interference fringe which does not reflect the shape of the alignment mark is avoided.

As a result, a signal of the irregular interference fringe will not incorporate in the detection signal based on the intensity of the reflected light which reflects the shape of the alignment mark, so it is possible to detect the position of the alignment mark clearly and the accuracy in the alignment of the object to be exposed based on the alignment mark relative to the master plate can be improved.

(6) Details of Chromatic Aberration Correcting System and Correction of Higher Order for Chroamtic Aberration The following description is mainly about the case where there is used such a "white light" (continuous spectrum) as in FIG. 27(b) in an optical alignment system using a monochromatic g-line exposure (NA=0.38 of the projection lens group 3) from a mercury lamp as in embodiment-1. But it is also applicable as such to the other light sources and embodiments, so the explanation of the others will be omitted.

Further, the exposure light is not limited to g-line; there also may be used h- and i-lines, as well as Excimer laser light.

The stepper used herein is based on the 5:1 Stepper 6400 DSW of GCA Co. (U.S.A.), and the projection lens 3 is a g-line projection lens Model 10-78-46 (NA 0.38) of Zeiss Co. (West Germany). In general, a lens system of this type comprises several to several ten lenses for removing various aberrations.

Figure 39:
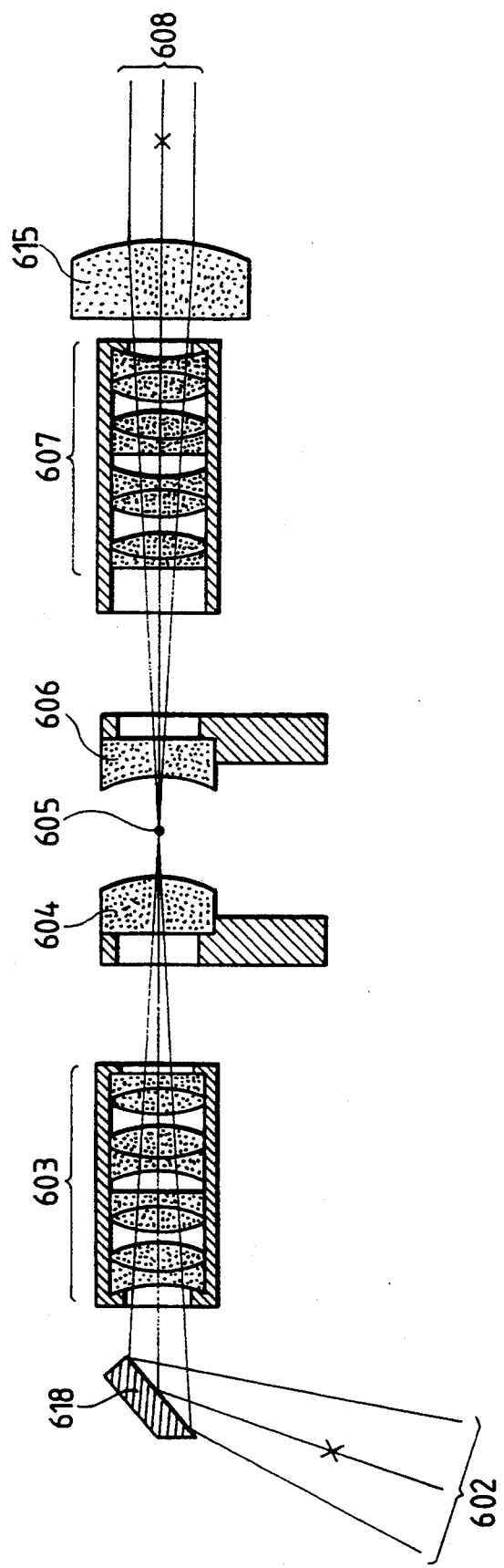
FIG. 39 is a sectional view in a Y direction showing an entire layout of a chromatic aberration and astigmatism correcting system (aligning optical system) in the invention.

FIG. 39 is a sectional view in the Y direction (vertical direction) showing an entire layout of a chroamtic aberration and astigmatism correcting lens system in the optical alignment system. In the same figure, the numeral 618 denotes an end mirror for taking out an alignment light to the outside of the axis of the projection lens 3 in a position below the mask or reticle 4; numeral 602 denotes an alignment light beam which is fed to the projection lens system 3 according to through-the-lens method; numeral 605 denotes an imaging point; numerals 603 and 607 each represent an achromatic lens group disposed substantially in a relation of point symmetry with respect to the imaging point; numerals 604 and 606 represent a pair of cylindrical lenses (crown glass lenses) for the correction of astigmatism, which lenses are also disposed substantially in a relation of point symmetry with respect to the imaging point 605. Numeral 615 denotes an achromatic relay lens (focal length: 36 mm) and numeral 608 denotes an alignment light beam travelling toward the beam splitter (FIG. 1).

Figure 40:
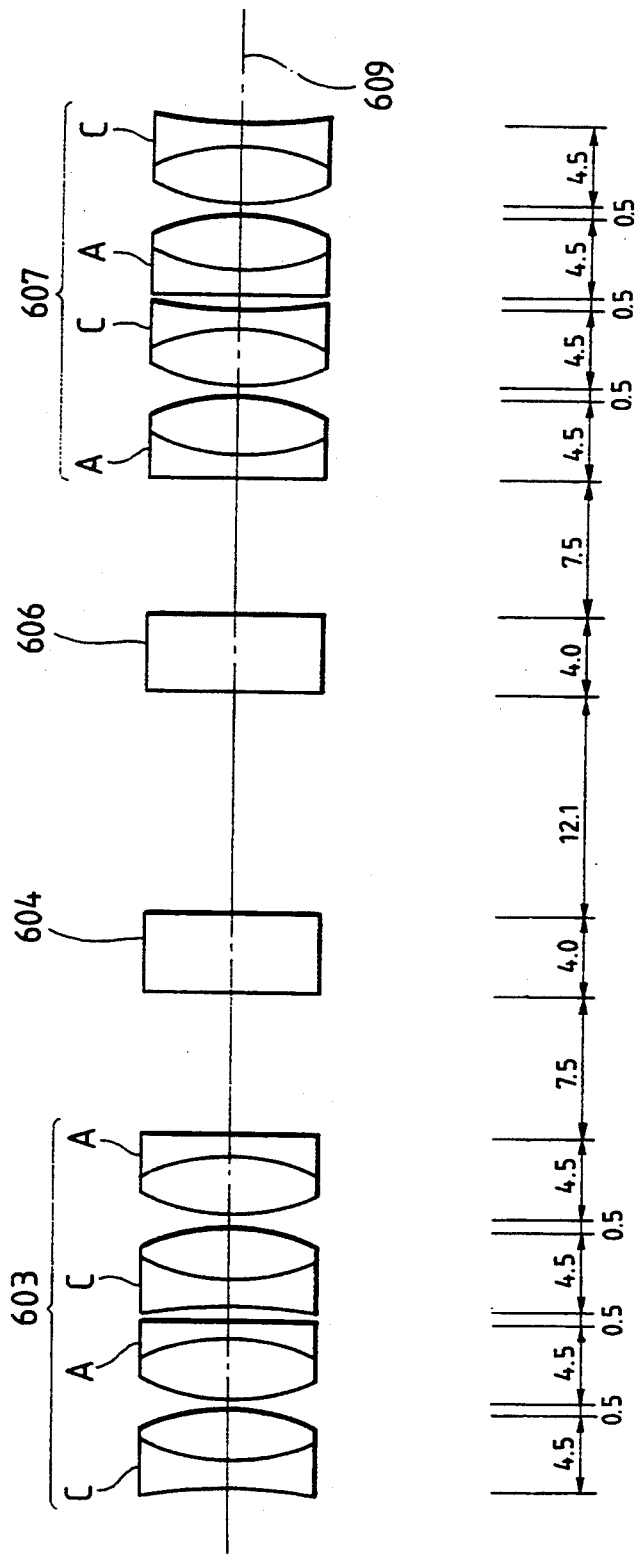
FIGS. 40 and 41 are sectional views in X and Y directions, respectively, of the said correction lens system.

FIG. 40 is a sectional view in the X direction (horizontal direction) of the above correction lens group. In the same figure there are shown in millimeter the thickness of each lens, spacing between adjacent lens surfaces, and radius of curvature of a spherical lens surface, (also shown in the following figures). The lens thickness means the distance between the centers (i.e., the point intersecting an optical axis 609 or Z axis) of both end faces of each laminated lens, and the spacing between adjacent lens surfaces means the distance between the centers of adjacent surfaces of adjacent lenses. The reference marks A and C represent types of the laminated achromatic lenses.

Figure 41:
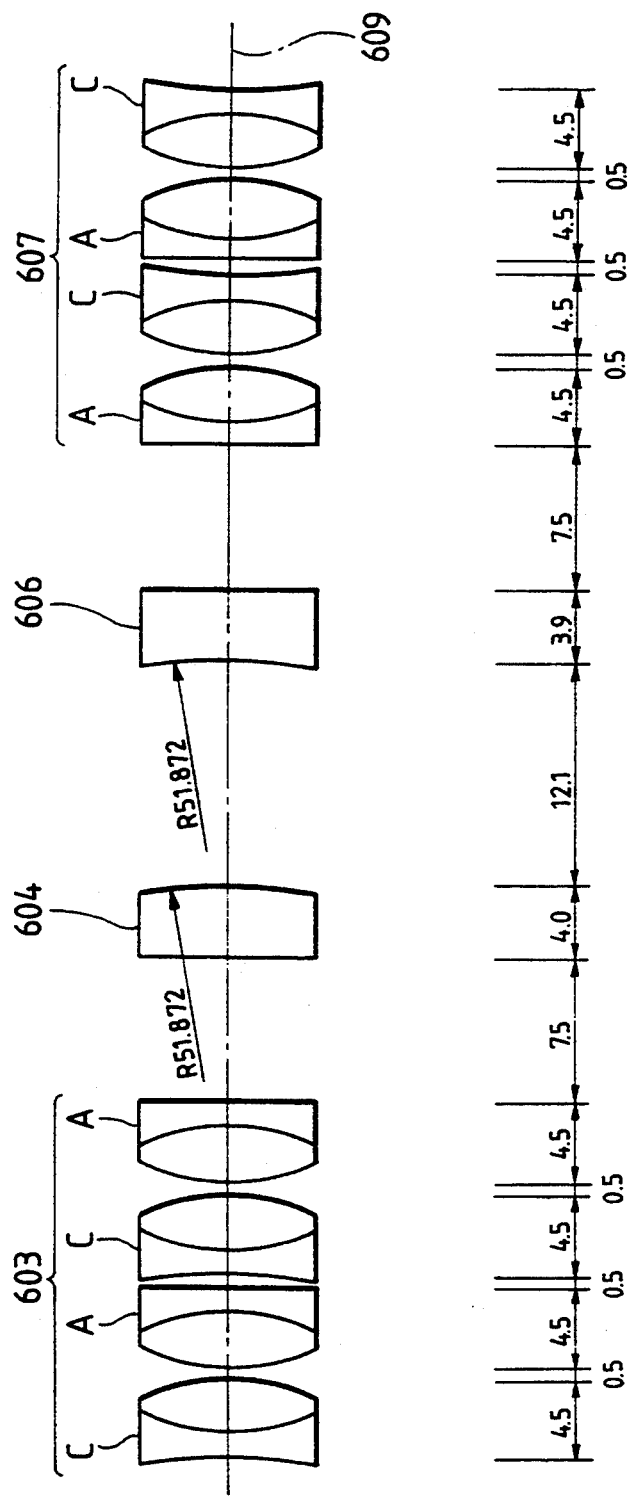
Figure 42:
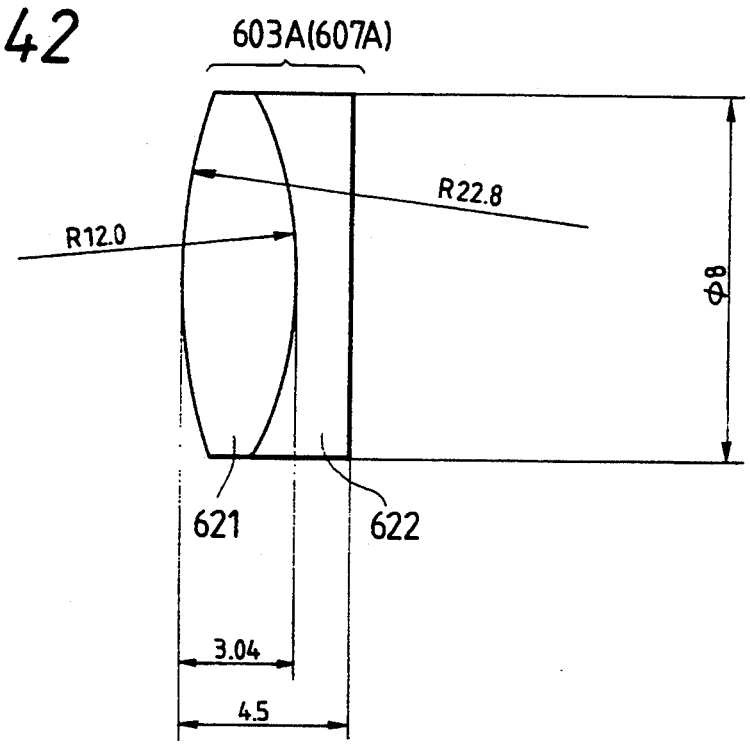
FIGS. 42 and 43 are sectional views showing detailed structures of laminated achromatic lenses (types A and C, respectively), the sections being any section including the optical axis since the lenses are spherical lenses.
Figure 43:
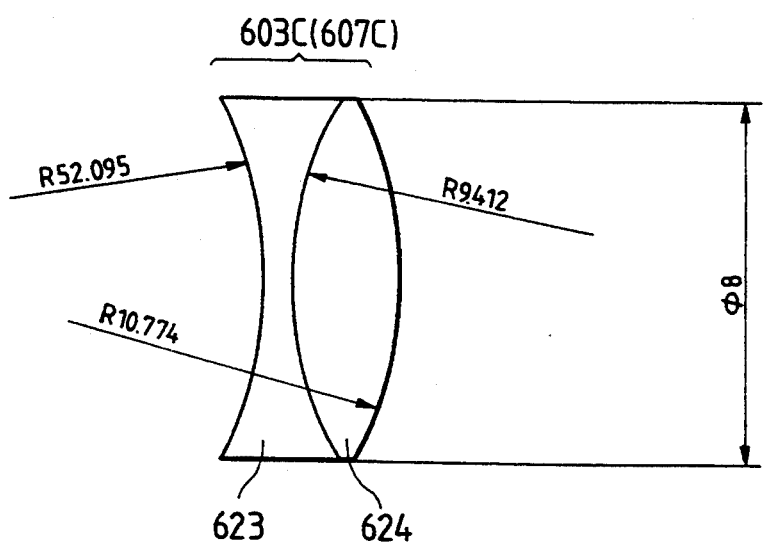

FIG. 41 is a sectional view in the Y direction of the correction lens group and FIG. 42 shows the details of an achromatic lens of type A. In FIG. 42, numerals 621 and 622 denote a crown glass lens and a flint glass lens, respectively. FIG. 43 shows the details of an achromatic lens of type C, wherein numerals 623 and 624 denote a flint glass lens and a crown glass lens, respectively. If the glass materials are shown in terms of Model numbers of Schott Co., 604, 606, 621 and 624 are crown glass (BK7), while 622 and 623 are flint glass (SF11).

In such layout, most of chromatic aberrations for D- and E-lines of the mercury lamp are eliminated, but without fine adjustment, there will remain to some extent a lateral deviation in the XY plane. This lateral deviation can be removed by shifting the chromatic aberration correcting lens groups 603 and 607 oppositely in the XY plane in the direction of the remaining chromatic deviation while substantially ensuring the symmetry with respect to the imaging point 605, and then fixing them at a point where the chromatic deivation disappears completely.

Figure 44:
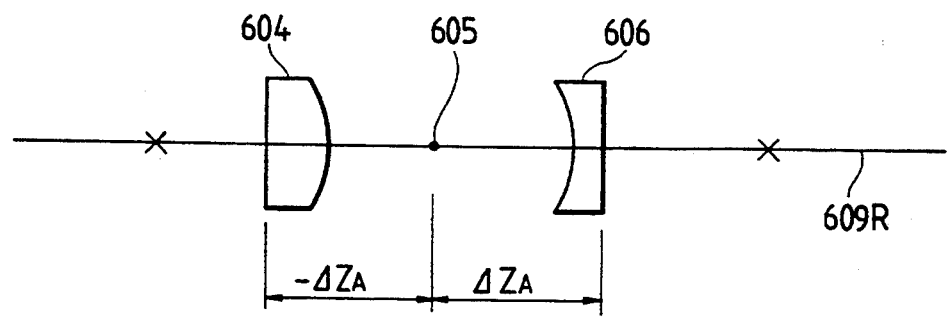
FIGS. 44 to 46 are schematic sectional views showing fine adjustments for chromatic aberration and astigmatism.
Figure 45:
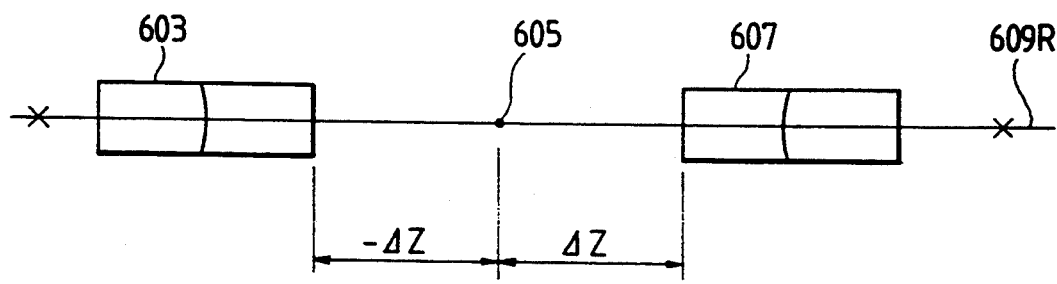
Figure 46:
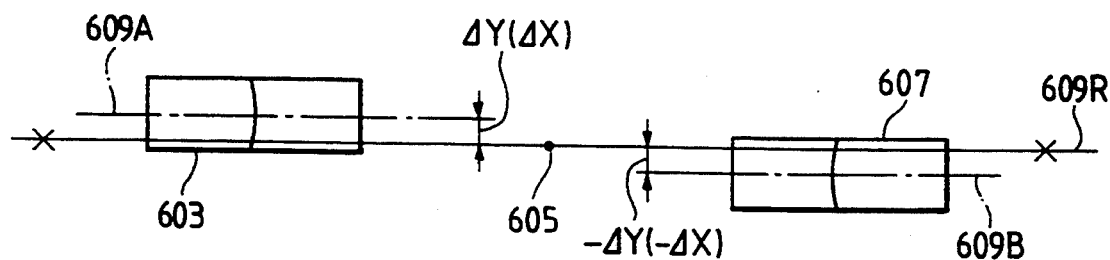

FIGS. 44 to 46 shows the details of fine adjustment in the correction lens system.

In FIG. 44, numeral 609R denotes an optical axis of a reference optical system which coincides with 609 in the previous figures; numeral 605 represent the first imaging point as noted previously; numerals 604 and 606 represent a pair of astigmatism correction lenses.

In FIGS. 45 and 46, numerals 603 and 607 each denote a chromatic aberration correcting lens group; and numerals 609A and 609B represent rotation symmetry axes of the chromatic aberration correcting lens groups 603 and 607, respectively.

Adjustment of the reference optical system is made in the following manner. First, the correction lens groups 603, 604, 606 and 607 are removed from the reference optical system shown in FIG. 39, leaving only achromat relay lens 615, and using only E-line, the position of the entrance pupil of the projection lens 3 (FIG. 1) is confirmed.

Next, the end mirror 618 is adjusted so that the image at the terminal end (an effective light sofurce point) of the optical fiber 13 (FIG. 1) is positioned centrally of the entrance pupil.

Next, the astigmatism correction lenses 604 and 606 are positioned symmetrically with respect to the imaging point 605 and $\Delta Z_A$ is adjusted as in FIG. 44 to minimize astigmatism.

Then, using a mixed light of E- and D-lines, $\Delta Z$, $\Delta Y$ and $\Delta X$ are adjusted successively as in FIGS. 45 and 46 in the state of FIG. 39 to minimize a deviation of focused position caused chromatically and an imaging deviation in the image height direction while looking at the pattern on the wafer. By so doing, with respect to E- and D-lines of the mercury lamp, the focal chroamtic aberration and magnification chromatic aberration are removed in the sense of the so-called "achromat". Spherical aberration is removed by suitably designing the curvature of each lens surface in the correction lens groups. Other aberrations are reduced to values causing no problem by disposing the correction lens groups symmetrically with respect to the imaging point 605 or by suitably designing correction lenses.

(7) Explanation of Literatures, etc. for Supplementing Embodiments

The following matters are described in the literatures, etc. to be mentioned, so reference will be made thereto in place of describing their details herein.

As to the device structure such as DRAM's wafer process and double-layer aluminum wiring, it is described in Murata et al's Japanese Patent Application No. 235906 (filed Sep. 19, 1987), its corresponding U.S.

patent application No. 246514 (filed Sep. 19, 1988) and its Korean Patent Application No. 11906/88.

As to a reduced magnification barometric compensation system, it is described in Komoriya et al's Japanese Patent Laid-Open No. 262421/85 (Application No. 118315/84, filed Jun, 11, 1984) and its corresponding U.S. Pat. No. 4,699,505 (registered Oct. 13, 1987), Shimizu et al's U.S. Pat. No. 4,606,273 (registered May 19, 1987) and Tanimoto et al's U.S. Pat. No. 4,690,528 (registered Sep. 1, 1987).

As the exposure light source, photoresist (positive type), alignment, and reduced projection exposure at large, these are described Ichiro Hoko, "Semiconductor Lighography Technique," Sangyo Tosho K.K. (May 30, 1986), pp. 20–26 and 81–102.

As to the cylindrical inner-surface mirror used for illumination (alignment), it is disclosed in Shiba et al's Japanese Patent Laid-Open No. 251858/86 (laid open Nov. 8, 1986).

As to the stepper alignment technique, it is explained in Nakazawa et al's Japanese Patent Laid-Open No. 102823/81 (laid open Aug. 17, 1981).

As to Köler's illumination, aperture or entrance pupil, aberration correction, filter, and geometric optics at large, these are explained in Hiroshi Kubota, "Optics," Iwanami Shoten (Oct. 30, 1968), pp. 41–276; ibid , . "Wave Optics," ibid (1971), pp. 199–236; F. A. Jenkins & H. E. White, "Fundamentals of Optics," McGraw-Hill Book Inc Chapters 1–10; M. Born & E. Wolf, "Principles of Optics," Pergamon Press, pp. 133–255, 418–428 and 522–526; and M. V. Klein, "Optics," John Wiley & Sons, Inc., pp. 106–118.

Further, as to optical materials, including lenses, they are shown in Kubota et al, "Optical Art handbook," Asakura Shoten (Mar. 1, 1987), pp. 551–674.

(8) Explanation of Various Effects obtained by the Embodiments of the Invention

According to the present invention, in exposing a semiconductor integrated circuit wafer to a monochromatic light such as g-, i- or h-line of a mercury lamp, using a reduced stepping exposure system, the alignment between the wafer and a mask or a reticle is performed by conducting light from a predetermined pattern on the wafer to an off-axis position by through-the-lens (TTL) method and observing it. In this case, the observation light taken out from below the reticle is passed through a chromatic aberration correcting lens, thereby permitting the use of a polychromatic or continuous spectrum light.

Moreover, since the reference light is taken out off axis before being reflected by or passing through the mask or reticle, there is no fear of being troubled by various aberrations caused by the flat plate of the mask.

Further, since the reference light is taken out below the reticle, etc., there is a sufficient space for the insertion of the optical correction system, thus permitting symmetrical arrangement so as to thoroughly remove spherical aberration, astigmatism, coma aberration, curvature of image field and distortion aberration, in addition to chromatic aberration.

Moreover, since the optical projection system extending from the reticle to the wafer lies on a straight line spatially, it is possible to remove various aberrations (of the projection system) thoroughly over a wide exposure area.

Additionally, since the main optical axis of the projection system and the gravitational axis are approximately coincident with each other, there is attained a structure difficult to be influenced by environment and it becomes easy to control time-series changes.

Although the present invention has been described above about the case where the exposure light is monochromatic and the reference optical system is in a bright field, the invention is not limited thereto; it goes without saying that the invention is applicable to the case where exposure is performed using a polychromatic or continuous spectrum light of a wave length shorter than that of the reference light and also applicable to a reference optical system in a dark field (diffraction or interference). Further, although the present invention has been described above with respect to the projection system wherein only the image side (wafer, etc.) is telecentric, it is also applicable to a system wherein an article side (reticle, etc.) is also telecentric.

What is claimed is:

1. A method of horizontally aligning a semiconductor wafer and transferring a pattern on a mask onto the semiconductor wafer, the semiconductor wafer having major surface, a photoresist film disposed on the major surface, and at least one alignment mark formed on the major surface, the method comprising the steps of:
(a) placing the semiconductor wafer on a movable XY wafer state disposed in a reduction projection exposure system, the reduction projection exposure system including a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to monochromatic exposure light beam, the photoresist film being sensitive to the monochromatic exposure light beam;
(b) moving the XY wafer stage to position the at least one alignment mark on the semiconductor wafer at a position off an optical axis of the reduction projection lens system;
(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is
incident on the at least one alignment marks,
reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting the reflected reference light beam having the corrected chromatic aberration with detecting means disposed outside the reduction projection lens system;

(f) detecting a horizontal position of the at least one alignment mark with respect to the reduction projection lens system based on the detected reflected reference light beam;

(g) movinq the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system, thereby aligning the semiconductor wafer at a desired position with respect to the mask without directly aligning the semiconductor wafer with respect to the mask;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source having a relatively uniform intensity at least within the predetermined bandwidth of the reference light beam as compared to an intensity of the exposure light source;

wherein the predetermined bandwidth of the reference light beam is sufficiently wide to prevent occurrence of an interference effect due to unevenness in a thickness of the photoresist film to a degree sufficient to enable detection of the at least one alignment mark with a predetermined accuracy, and is sufficiently narrow to enable correction of chromatic aberration of the reference light beam to a degree sufficient to enable detection of the at least one alignment mark with the predetermined accuracy; and wherein the predetermined bandwidth of the reference light beam is substantially less than a bandwidth of white light.

2. A method according to claim 1, wherein the reference light beam is neither incident on the mask nor transmitted through the mask at any point on an entire optical path of the reference light beam between the at least one alignment mark and the detecting means.

3. A method according to claim 2, wherein the wavelengths of the reference light beam are within a visible spectrum.

4. A method according to claim 3, wherein the chromatic aberration correcting optical system includes a plurality of chromatic aberration correction lenses.

5. A method according to claim 4, wherein the plurality of chromatic aberration correction lenses includes at least one pair of a convex lens made of a first glass and a concave lens made of a second glass different from the first glass.

6. A method according to claim 5, wherein the detecting means is a TV camera.

7. A method according to claim 6, wherein the predetermined magnification is substantially 1/5.

8. A method according to claim 7 wherein the reference light source is a xenon lamp.

9. A method of horizontally aligning a semiconductor wafer in a reduction projection exposure system, the reduction projection exposure system including:

means for illuminating a pattern on a mask with a monochromatic exposure light;

a movable wafer stage for holding a semiconductor wafer having a surface, at least one alignment mark being formed on the surface, and a photoresist film being disposed on the surface, the photoresist film being sensitive to the monochromatic exposure light; and a reduction projection lens system for projecting a real reduction image of the pattern illuminated by the monochromatic exposure light onto the photoresist film;

the method being performed prior to projecting the real reduction image of the pattern onto the photoresist film, and comprising the steps of:

placing the semiconductor wafer on the wafer stage;

moving the wafer stage to position the at least one alignment mark on the semiconductor wafer at a position off an optical axis of the reduction projection lens system;

illuminating the at least one alignment mark on the semiconductor wafer with a reference light while the at least one alignment mark is at the position off the optical axis of the reduction projection lens system such that the reference light is reflected from the at least one alignment mark, the reference light including a continuous spectrum light, wavelengths of the reference light being longer than a wavelength of the monochromatic exposure light, the photoresist film being substantially insensitive to the reference light;

correcting, at least within a predetermined bandwidth of the reference light, longitudinal chromatic aberration of the reflected reference light, the longitudinal chromatic aberration including longitudinal chromatic aberration due to wavelength differences between the wavelengths of the reference light;

detecting the reflected reference light having the corrected chromatic aberration at a position outside the reduction projection lens system;

detecting a horizontal position of the at least one alignment mark with respect to the reduction projection lens system on the basis of the detected reflected reference light; and moving the wafer stage to horizontally align the semiconductor wafer at a desired horizontal position with respect to the reduction projection lens system on the basis of the detected horizontal position of the at least one alignment mark;

wherein the predetermined bandwidth of the reference light is substantially less than a bandwidth of white light.

10. A method according to claim 9, wherein the reference light is neither incident on the mask nor transmitted through the mask at any point on an entire optical path of the reference light between a source of the reference light and the position outside the reduction projection lens system where the reflected reference light having the corrected chromatic aberration is detected.

11. A method according to claim 9, wherein the reference light is neither incident on the mask nor transmitted through the mask at any point on an entire optical path of the reference light between the at least one alignment mark and the position outside the reduction projection lens system where the reflected reference light having the corrected chromatic aberration is detected.

12. A method according to claim 9, wherein the illuminating step is performed such that the reference light and the reflected reference light travel over substantially the same optical path.

13. A method according to claim 12, wherein the illuminating step is performed such that the reference light is incident to the at least one alignment mark at a predetermined angle smaller than 90° with respect to the surface of the semiconductor wafer.

14. A method according to claim 9, wherein the illuminating step is performed such that the reference light is reflected from the at least one alignment mark through the reduction projection lens system to a reflecting means disposed off an optical axis of the reduction projection lens system, the reflected reference light being reflected by the reflecting means to the position outside the reduction projection lens system for detection in the reflected light detecting step, and wherein the longitudinal chromatic aberration of the reflected reference light is caused by the reduction projection lens system.

15. A method according to claim 14, wherein the illuminating step is performed such that the reference light passes through the reduction projection lens system to illuminate the at least one alignment mark, and such that the reference light and the reflected reference light travel over substantially the same optical path within the reduction projection lens system.

16. A method according to claim 15, wherein the illuminating step is performed such theft the reference light is incident to the at least one alignment mark at a predetermined angle smaller than 90° with respect to the surface of the semiconductor wafer.

17. A method according to claim 14, wherein the reduction projection lens system is corrected for selected optical aberrations at the wavelength of the monochromatic exposure light.

18. A method according to claim 17, wherein the illuminating step is performed such that the reference light passes through the reduction projection lens system to illuminate the at least one alignment mark, and such that the reference light and the reflected reference light travel over substantially the same optical path within the reduction projection lens system.

19. A method according to claim 18, wherein the illuminating step is performed such that the reference light is incident to the at least one alignment mark at a predetermined angle smaller than 90° with respect to the surface of the semiconductor wafer.

20. A method of horizontally aligning a semiconductor wafer in a reduction projection exposure system, the reduction projection exposure system including:

means for illuminating a pattern on a mask with a monochromatic exposure light;

a movable wafer stage for holding a semiconductor wafer having a surface, at least one alignment mark being formed on the surface, and a photoresist film being disposed on the surface, the photoresist film being sensitive to the monochromatic exposure light; and a reduction projection lens system for projecting a real reduction image of the pattern illuminated by the monochromatic exposure light onto the photoresist film;

the method being performed prior to projecting the real reduction image of the pattern onto the photoresist film, and comprising the step of:

placing the semiconductor wafer on the wafer stage;

moving the wafer stage to position the at least one alignment mark on the semiconductor wafer at a position off an optical axis of the reduction projection lens system;

illuminating the at least one alignment mark on the semiconductor wafer with a reference light while the at least one alignment mark is at the position off the optical axis of the reduction projection lens system such that the reference light is reflected from the at least one alignment mark, the reference light including a continuous spectrum light, wavelengths of the reference light being longer than a wavelength of the monochromatic exposure light, the photoresist film being substantially insensitive to the reference light;

correcting, at least within a predetermined bandwidth of the reference light, longitudinal chromatic aberration of the reflected reference light, the longitudinal chromatic aberration including longitudinal chromatic aberration due to wavelength differences between the wavelengths of the reference light;

detecting the reflected reference light having the corrected chromatic aberration at a position outside the reduction projection lens system;

detecting a horizontal position of the at least one alignment mark with respect to the reduction projection lens system on the basis of the detected reflected reference light; and moving the wafer stage to horizontally align the semiconductor wafer at a desired horizontal position with respect to the reduction projection lens system on the basis of the detected horizontal position of the at least one alignment mark;

wherein the reference light is a reference light from a continuous spectrum reference light source;

wherein the predetermined bandwidth of the reference light is sufficiently wide to prevent occurrence of an interference effect due to unevenness in a thickness of the photoresist film to a degree sufficient to enable detection of the at least one alignment mark with a predetermined accuracy, and is sufficiently narrow to enable correction of chromatic aberration of the reflected reference light to a degree sufficient to enable detection of the at least one alignment mark with the predetermined accuracy;

wherein the continuous spectrum reference light source has a relatively uniform intensity at least within the predetermined bandwidth of the reference light as compared to an intensity of the monochromatic exposure light; and wherein the predetermined bandwidth of the reference light is substantially less than a bandwidth of white light.

21. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a movable XY wafer stage;

(b) moving the XY wafer stage to position the at least one alignment mark on the semiconductor wafer at a position off an optical axis of a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to the monochromatic exposure light beam, the photoresist film being sensitive to the monochromatic exposure light beam;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment mark, reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting the reflected reference light beam having the corrected chromatic aberration with detecting means disposed outside the reduction projection lens system;

(f) detecting a horizontal position of the at least one alignment mark with respect to the reduction projection lens system based on the detected reflected reference light beam;

(g) moving the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermine magnification;

the steps (h)–(i) being performed after the steps (a)–(g) have been completed;

wherein the predetermined bandwidth of the reference light beam is substantially less than a bandwidth of white light.

22. A method according to claim 21, wherein the reference light beam is neither incident on the mask nor transmitted through the mask at any point on an entire optical path of the reference light beam between the reference light source and the detecting means.

23. A method according to claim 21, wherein the reference light beam is neither incident on the mask nor transmitted through the mask at any point on an entire optical path of the reference light beam between the at least one alignment mark and the detecting means.

24. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a moveable XY wafer stage;

(b) moving the XY wafer stage to position the at least one alignment mark on the semiconductor wafer at a position off an optical axis of a reduction projection lens system for projection a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to the monochromatic exposure light beam, the photoresist film being sensitive to the monochromatic exposure light beam;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment marks,
  reflected from the at least one alignment mark back through the reduction projection lens system along an optical path substantially the same as the optical path along which the reference light beam was directed through the reduction projection lens system,
  incident on reflecting means disposed off the optical axis of the reduction projection lens system, and
  reflected from the reflecting means to a position outside the reduction projection lens system,
  the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting the reflected reference light beam having the corrected chromatic aberration with detecting means disposed outside the reduction projection lens system;

(f) detecting a horizontal position of the at least one alignment mark with respect to the reduction projection lens system based on the detected reflected reference light beam;

(g) moving the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system, (h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source;

wherein the predetermined bandwidth of the reference light beam is sufficiently wide to prevent occurrence of an interference effect due to unevenness in a thickness of the photoresist film to a degree sufficient to enable detection of the at least one alignment mark with a predetermined accuracy, and is sufficiently narrow to enable correction of chromatic aberration of the reference light beam to a degree sufficient to enable detection of the at least one alignment mark with the predetermined accuracy;

wherein the continuous spectrum reference light source has a relatively uniform intensity at least within the predetermined bandwidth of the reference light beam as compared to an intensity of the exposure light source; and wherein the predetermined bandwidth of the reference light beam is substantially less than a bandwidth of white light.

25. A method according to claim 24, wherein the reference light beam is neither incident on the mask nor transmitted through the mask at any point on an entire optical path of the reference light beam between the reference light source and the detecting means.

26. A method according to claim 24, wherein the reference light beam is neither incident on the mask nor transmitted through the mask at any point on an entire optical path of the reference light beam between the at least one alignment mark and the detecting means.

27. A method according to claim 24, wherein the exposure light source is a line spectrum light source radiating at least one spectral line, the at least one spectral line including one spectral line being radiated as the monochromatic exposure light beam.

28. A method according to claim 27, wherein the line spectrum light source is a mercury lamp radiating at least a g-line, the g-line being radiated as the monochromatic exposure light beam.

29. A method according to claim 24, wherein the reference light source is a xenon lamp.

30. A method according to claim 24, wherein the predetermined magnification is substantially 1/5.

31. A method according to claim 30, wherein the exposure light source is a line spectrum light source radiating at least one spectral line, the at least one spectral line including one spectral line being radiated as the monochromatic exposure light beam.

32. A method according to claim 31, wherein the wavelengths of the reference light beam are within a visible spectrum.

33. A method according to claim 24, wherein the wavelengths of the reference light beam are within a visible spectrum.

34. A method according to claim 24, wherein the chromatic aberration correcting optical system includes a plurality of chromatic aberration correction lenses.

35. A method according to claim 34, wherein the plurality of chromatic aberration correction lenses includes at least one pair of a convex lens made of a first glass and a concave lens made of a second glass different from the first glass.

36. A method according to claim 24, wherein the chromatic aberration correcting optical system includes at least one pair of a convex lens made of a first glass and a concave lens made of a second glass different from the first glass.

37. A method according to claim 24, wherein the detecting means is a TV camera.

38. A method according to claim 37, wherein the wavelengths of the reference light beam are within a visible spectrum.

39. A method according to claim 38, wherein the predetermined magnification is substantially 1/5.

40. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a movable XY wafer stage disposed in a reduction projection exposure system, the reduction projection exposure system including a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to monochromatic exposure light beam, the photoresist film being sensitive to the monochromatic exposure light beam;

(b) moving the XY wafer stage to position the at least one alignment mark on the semiconductor wafer at a position off an optical axis of the reduction projection lens system;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment mark, reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting an image of the at least one alignment mark included in a portion of the reflected reference light beam having the corrected chromatic aberration with detecting means disposed outside the reduction projection lens system;

(f) detecting a horizontal position of the at least one alignment mark with respect to the reduction projection lens system based on the detected image of the at least one alignment mark;

(g) movinq the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system, thereby aligning the semiconductor wafer at a desired position with respect to the mask without directly aligning the semiconductor wafer with respect to the mask;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source having a relatively uniform intensity at least within the predetermined bandwidth of the reference light beam as compared to an intensity of the spectrum of a mercury lamp constituting a line spectrum light source; and wherein the predetermined bandwidth of the reference light beam is substantially less than a bandwidth of white light.

41. A method according to claim 40, wherein the predetermined bandwidth of the reference light beam is sufficiently wide to prevent occurrence of an interference effect due to unevenness in a thickness of the photoresist film to a degree sufficient to enable detection of the at least one alignment mark with a predetermined accuracy, and is sufficiently narrow to enable correction of chromatic abberration of the reference light beam to a degree sufficient to enable detection of the at least one alignment mark with the predetermined accuracy.

42. A method according to claim 41, wherein the wavelengths of the reference light beam are within a visible spectrum.

43. A method according to claim 42, wherein the chromatic aberration correcting optical system includes a plurality of chromatic aberration correction lenses.

44. A method according to claim 43, wherein the exposure light source is a line spectrum light source.

45. A method according to claim 44, wherein the reference light beam is neither incident on the mask nor transmitted through the mask at any point on an entire optical path of the reference light beam between the at least one alignment mark and the detecting means.

46. A method according to claim 45, wherein the detecting means is a TV camera.

47. A method according to claim 46, wherein the predetermined magnification is substantially 1/5.

48. A method of horizontally aligning a semiconductor wafer in a reduction projection exposure system, the reduction projection exposure system including:

means for illuminating a pattern on a mask with a monochromatic exposure light;

a movable wafer stage for holding a semiconductor wafer having a surface, at least one alignment mark being formed on the surface, and a photoresist film being disposed on the surface, the photoresist film being sensitive to the monochromatic exposure light; and a reduction projection lens system for projecting a real reduction image of the pattern illuminated by the monochromatic exposure light onto the photoresist film;

the method being performed prior to projecting the real reduction image of the pattern onto the photoresist film, and comprising the steps of:

placing the semiconductor wafer on the wafer stage;

moving the wafer stage to position the at least one alignment mark on the semiconductor wafer at a position off an optical axis of the reduction projection lens system;

illuminating the at least one alignment mark on the semiconductor wafer with a reference light while the at least one alignment mark is at the position off the optical axis of the reduction projection lens system such that the reference light is reflected from the at least one alignment mark, the reference light including a continuous spectrum light, wavelengths of the reference light being longer than a wavelength of the monochromatic exposure light, the photoresist film being substantially insensitive to the reference light;

correcting, at least within a predetermined bandwidth of the reference light, longitudinal chromatic aberration of the reflected reference light, the longitudinal chromatic aberration including longitudinal chromatic aberration due to wavelength differences between the wavelengths of the reference light;

detecting the reflected reference light having the corrected chromatic aberration at a position outside the reduction projection lens system;

detecting a horizontal position of the at least one alignment mark with respect to the reduction projection lens system on the basis of the detected reflected reference light; and moving the wafer stage to horizontally align the semiconductor wafer at a desired horizontal position with respect to the reduction projection lens system on the basis of the detected horizontal position of the at least one alignment mark;

wherein the reference light is a reference light from a continuous spectrum reference light source;

wherein the continuous spectrum reference light source has a relatively uniform intensity at least within the predetermined bandwidth of the reference light as compared to an intensity of the monochromatic exposure light; and wherein the predetermined bandwidth of the reference light is substantially less than a bandwidth of white light.

49. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a movable XY wafer stage;

(b) moving the XY wafer stage to position the at least one alignment mark on the semiconductor wafer at a position off an optical axis of a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to the monochromatic exposure light beam, the photoresist film being sensitive to the monochromatic exposure light beam;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment mark, reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting the reflected reference light beam having the corrected chromatic aberration with detecting means disposed outside the reduction projection lens system;

(f) detecting a horizontal position of the at least one alignment mark with respect to the reduction projection lens system based on the detected reflected reference light beam;

(g) moving the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source;

wherein the continuous spectrum reference light source has a relatively uniform intensity at least within the predetermined bandwidth of the reference light beam as compared to an intensity of the exposure light source; and wherein the predetermined bandwidth of the reference light beam is substantially less than a bandwidth of white light.

50. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a movable XY wafer stage disposed in a reduction projection exposure system, the reduction projection exposure system including a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to the monochromatic exposure light beam, the photoresist film being sensitive to the monochromatic exposure light beam;

(b) moving the XY wafer stage to position the at least one alignment mark on the semiconductor wafer at a position off an optical axis of the reduction projection lens system;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment mark, reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting the reflected reference light beam having the corrected chromatic aberration with detecting means disposed outside the reduction projection lens system;

(f) detecting a horizontal position of the at least one alignment mark with respect to the reduction projection lens system based on the detected reflected reference light beam;

(g) moving the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system, thereby aligning the semiconductor wafer at a desired position with respect to the mask without directly aligning the semiconductor wafer with respect to the mask;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source having a relatively uniform intensity at least within the predetermined bandwidth of the reference light beam as compared to an intensity of the exposure light source;

wherein the predetermined bandwidth of the reference light beam is sufficiently wide to prevent occurrence of an interference effect due to unevenness in a thickness of the photoresist film to a degree sufficient to enable detection of the at least one alignment mark with a predetermined accuracy, and is sufficiently narrow to enable correction of chromatic aberration of the reference light beam to a degree sufficient to enable detection of the at least one alignment mark with the predetermined accuracy; and wherein the predetermined bandwidth of the reference light beam is substantially less than a bandwidth of white light.

51. A method of horizontally aligning a semiconductor wafer and transferring a pattern on a mask onto the semiconductor wafer, the semiconductor wafer having a major surface, a photoresist film disposed on the major surface, and at least one alignment mark formed on the major surface, the method comprising the steps of:

(a) placing the semiconductor wafer on a movable XY wafer stage disposed in a reduction projection exposure system, the reduction projection exposure system including a reduction projection lens system for projecting a real reduction image of the pattern on the mask onto the photoresist film, the real reduction image being reduced in size relative to the pattern by a predetermined magnification, the reduction projection lens system having lens aberrations corrected with respect to a monochromatic exposure light beam from an exposure light source to be used to illuminate the pattern on the mask through mask illuminating means such that the reduction projection lens system has optimum optical characteristics with respect to the monochromatic exposure light beam, the photoresist film being sensitive to the monochromatic exposure light beam;

(b) moving the XY wafer stage to position the at least one alignment mark on the semiconductor wafer at a position off an optical axis of the reduction projection lens system;

(c) illuminating the at least one alignment mark on the semiconductor wafer through the reduction projection lens system with a reference light beam from a reference light source while the at least one alignment mark is at the position off the optical axis of the reduction projection lens system, the reference light beam including a continuous spectrum light beam having wavelengths longer than a wavelength of the monochromatic exposure light beam, the photoresist film being substantially insensitive to the reference light beam, the at least one alignment mark being illuminated through the reduction projection lens system by directing the reference light beam through the reduction projection lens system along an optical path such that the reference light beam is incident on the at least one alignment mark, reflected from the at least one alignment mark back through the reduction projection lens system along an optical path substantially the same as the optical path along which the reference light beam was directed through the reduction projection lens system, incident on reflecting means disposed off the optical axis of the reduction projection lens system, and reflected from the reflecting means to a position outside the reduction projection lens system, the reflecting means being disposed such that the reflecting means substantially does not block the real reduction image when the reduction projection lens system projects the real reduction image onto the photoresist film;

(d) correcting, at least within a predetermined bandwidth of the reference light beam, chromatic aberration of the reference light beam reflected from the reflecting means with a chromatic aberration correcting optical system disposed at the position outside the reduction projection lens system, the chromatic aberration of the reference light beam being caused by the reduction projection lens system when the reference light beam passes through the reduction projection lens system and including chromatic aberration due to wavelength differences between the wavelengths of the reference light beam;

(e) detecting an image of the at least one alignment mark included in a portion of the reflected reference light beam having the corrected chromatic aberration with detecting means disposed outside the reduction projection lens system;

(f) detecting a horizontal position of the at least one alignment mark with respect to the reduction projection lens system based on the detected image of the at least one alignment mark;

(g) moving the XY wafer stage to horizontally align the semiconductor wafer at a desired horizontal position with respect to the reduction projection lens system based on the detected horizontal position of the at least one alignment mark such that a desired portion of the semiconductor wafer is substantially aligned with the optical axis of the reduction projection lens system, thereby aligning the semiconductor wafer at a desired position with respect to the mask without directly aligning the semiconductor wafer with respect to the mask;

(h) illuminating the pattern on the mask through the mask illuminating means with the monochromatic exposure light beam; and (i) projecting a real reduction image of the pattern on the mask illuminated by the monochromatic exposure light beam onto the photoresist film with the reduction projection lens system while keeping the desired portion of the semiconductor wafer substantially aligned with the optical axis of the reduction projection lens system, thereby transferring the pattern on the mask onto the photoresist film at the predetermined magnification;

the steps (h)–(i) being performed after the steps (a)–(g) have been completed;

wherein the reference light source is a continuous spectrum reference light source having a relatively uniform intensity at least within the predetermined bandwidth of the reference light beam as compared to an intensity of the exposure light source; and wherein the predetermined bandwidth of the reference light beam is substantially less than a bandwidth of white light.

* * * * *